United States Patent
Godovskii et al.

(10) Patent No.: US 12,424,278 B2
(45) Date of Patent: Sep. 23, 2025

(54) ANALOG HARDWARE REALIZATION OF NEURAL NETWORKS HAVING VARIABLE WEIGHTS

(71) Applicant: PolyN Technology Limited, Bristol (GB)

(72) Inventors: Dmitrii Godovskii, Bucharest (RO); Aleksandrs Timofejevs, Riga (LV); Boris Maslov, Palmetto, FL (US)

(73) Assignee: PolyN Technology Limited, Bristol (GB)

( * ) Notice: Subject to any disclaimer, the term of this patent is extended or adjusted under 35 U.S.C. 154(b) by 146 days.

(21) Appl. No.: 18/227,901

(22) Filed: Jul. 28, 2023

(65) Prior Publication Data

US 2025/0037762 A1    Jan. 30, 2025

(51) Int. Cl.
*G11C 13/00*    (2006.01)
*G06N 3/065*    (2023.01)
*G11C 11/54*    (2006.01)

(52) U.S. Cl.
CPC ......... *G11C 13/0026* (2013.01); *G06N 3/065* (2023.01); *G11C 11/54* (2013.01); *G11C 13/0004* (2013.01)

(58) Field of Classification Search
CPC . G11C 13/0026; G11C 11/54; G11C 13/0004; G06N 3/065
USPC .................................................. 365/148, 158
See application file for complete search history.

(56) References Cited

U.S. PATENT DOCUMENTS

| | | | |
|---|---|---|---|
| 11,200,948 B1 * | 12/2021 | Ambrosi | G11C 13/0007 |
| 2019/0012593 A1 * | 1/2019 | Obradovic | G06N 3/063 |
| 2019/0057507 A1 * | 2/2019 | El-Khamy | G06T 11/60 |
| 2020/0210840 A1 | 7/2020 | Darvish Rouhani et al. | |
| 2020/0302268 A1 | 9/2020 | Song et al. | |
| 2021/0109668 A1 * | 4/2021 | Kale | G06F 3/0604 |
| 2021/0109872 A1 * | 4/2021 | Kale | G06F 13/1668 |
| 2021/0142847 A1 * | 5/2021 | Kim | G11C 11/4097 |
| 2021/0406667 A1 * | 12/2021 | Timofejevs | G06N 3/065 |
| 2022/0019885 A1 * | 1/2022 | Jung | G06F 7/5443 |
| 2022/0027130 A1 * | 1/2022 | Kashmiri | G06N 3/048 |
| 2022/0147803 A1 * | 5/2022 | Dalgaty | G06N 3/088 |
| 2022/0280072 A1 * | 9/2022 | Timofejevs | G06F 18/24147 |

(Continued)

OTHER PUBLICATIONS

Polyn Technology Limited, International Search Report and Written Opinion, PCT/US2024/039916, Sep. 23, 2024, 13 pgs.

*Primary Examiner* — Michael T Tran
(74) *Attorney, Agent, or Firm* — SankerIP

(57) ABSTRACT

Systems, devices, integrated circuits, and methods are provided for analog hardware realization of neural networks. An electronic device includes a plurality of resistors corresponding to a plurality of weights of a neural network and one or more amplifiers coupled to the plurality of resistors. The plurality of resistors includes a first resistor corresponding to a first weight of the neural network. The one or more amplifiers and the plurality of resistors are configured to form a neural network circuit associated with the neural network. The first resistor has a variable resistance. In some embodiments, the first resistor is formed based on a crossbar array of resistive elements or a crossbar array of memory cells. Each resistive element or memory cell is located at a cross point of, and electrically coupled between, a respective word line and a respective bit line.

28 Claims, 12 Drawing Sheets

(56) References Cited

U.S. PATENT DOCUMENTS

| | | |
|---|---|---|
| 2022/0383921 A1 | 12/2022 | Rizzolo et al. |
| 2023/0004789 A1* | 1/2023 | Obradovic ............. G06N 3/063 |
| 2023/0022795 A1 | 1/2023 | Gao et al. |
| 2023/0029509 A1 | 2/2023 | Lee et al. |
| 2023/0081715 A1* | 3/2023 | Timofejevs ............ G06N 3/065 |
| | | 706/21 |
| 2023/0268004 A1* | 8/2023 | Tran ................... G11C 16/3459 |
| | | 365/185.03 |

* cited by examiner

ANALOG HARDWARE REALIZATION OF NEURAL NETWORKS HAVING VARIABLE WEIGHTS

TECHNICAL FIELD

The disclosed embodiments relate generally to electronic circuits, and more specifically to systems and methods for hardware realization of neural networks.

BACKGROUND

Conventional hardware has failed to keep pace with innovation in neural networks and the growing popularity of machine learning based applications. The complexity of neural networks continues to outpace computational power of state-of-the-art processors as digital microprocessor advances are plateauing. Neuromorphic processors based on spike neural networks, such as Loihi and True North, are limited in their applications. For GPU-like architectures, the power and speed of such architectures are limited by data transmission speed. Data transmission can consume up to 80% of chip power and can significantly impact the speed of calculations. Edge applications demand low power consumption, but there are currently no known performant hardware embodiments that consume low power (e.g., less than 50 milliwatts).

Additionally, a training process required for neural networks presents unique challenges for hardware realization of neural networks. A trained neural network is used for specific inferencing tasks, such as classification. Once a neural network is trained, a hardware equivalent is manufactured. When the neural network is retrained, the hardware manufacturing process is repeated to provide a brand-new hardware, which inevitably drives up hardware costs for analog realization of neural networks. Although some reconfigurable hardware solutions exist, such hardware cannot be easily mass produced, and costs a lot more (e.g., five times more) than hardware that is not reconfigurable. It would be beneficial to have a more efficient reprogramming mechanism for analog hardware realization of neural networks than the current practice.

SUMMARY

Accordingly, there is a need for methods, systems, devices, circuits, and/or interfaces that address at least some of the deficiencies identified above and provide an efficient reprogramming mechanism for analog hardware realization of neural networks that is better than the current practice (e.g., re-manufacturing an entire chip after retraining of a neural network). Analog circuits have been modeled and manufactured to realize trained neural networks, which provide at least improved performance per watt compared with digital realization using arithmetic units and registers. Specifically, a neural network is implemented in an electronic device using a plurality of resistors and one or more amplifiers. The plurality of resistors corresponds to a plurality of weights of the neural network. At least one of the plurality of resistors corresponds to a respective weight of the neural network. The at least one resistor has variable resistance that is adjusted based on one of a plurality of mechanisms. As the neural network is retrained, the respective weight corresponding to the at least one resistor has a different value, and the variable resistance of the at least one resistor is adjusted to track the different value of the respective weight, thereby realizing the retrained neural network based on the same hardware realization without re-manufacturing the corresponding analog circuit.

Further, many embodiments do not require hardware re-programmability across the entire hardware realization (e.g., the entire chip) of a neural network, particularly in edge environments where smart-home applications are applied. On-chip learning only impacts a small portion (e.g., 10%) of the hardware realization of a neural network, while a large portion (e.g., 90%) of hardware realization of the neural network remains the same without any changes of resistance values of resistors. Stated another way, in some embodiments, only a limited number of resistors of an analog realization of a neural network need to be adjusted after retraining of the neural network during the chip lifetime, which can be conveniently implemented using efficient resistance adjustment mechanisms without requiring the entire analog realization to be re-modeled and manufactured.

In one aspect, an electronic device includes a plurality of resistors and one or more amplifiers coupled to the plurality of resistors. The plurality of resistors corresponds to a plurality of weights of a neural network and includes a first resistor corresponding to a first weight of the neural network. The one or more amplifiers and the plurality of resistors are configured to form a neural network circuit associated with the neural network. In some embodiments, the first resistor has variable resistance. Further, in some embodiments, the first resistor includes at least one photo resistor, which is configured to be exposed to light from a controllable source of light. The variable resistance of the first resistor depends on the brightness level of the controllable source of light.

In some embodiments, the first resistor further includes a crossbar array of resistive elements having a plurality of word lines, a plurality of bit lines, and a plurality of resistive elements. Each resistive element is located at a cross point of, and electrically coupled between, a respective word line and a respective bit line. Further, in some embodiments, a controller is coupled to the crossbar array of resistive elements, and configured to select a subset of the plurality of resistive elements to form the first resistor. Specifically, in some embodiments, each of the subset of selected resistive elements is coupled to one of a set of word lines and one of a set of bit lines. The electronic device includes a first selection circuit and a second selection circuit. The first selection circuit is configured to select a first subset of the set of word lines to be coupled to a first resistive terminal of the first resistor. The second selection circuit is configured to select a second subset of the set of word lines to be coupled to a second resistive terminal of the first resistor.

In some embodiments, the first resistor includes a base resistor and a variable resistor. The variable resistor is coupled in parallel with the base resistor and further includes the crossbar array of resistive elements. Alternatively, the variable resistor is coupled in series with the base resistor and further includes the crossbar array of resistive elements.

In some embodiments, the first resistor further includes a crossbar array of NOR flash memory cells having a plurality of word lines, a plurality of bit lines, and a plurality of NOR flash memory cells. Each NOR flash memory cell is located at a cross point of, and electrically coupled between, a respective word line and a respective bit line and configured to provide a respective NOR flash memory cell as a respective resistive element.

In some embodiments, the first resistor further includes a crossbar array of memristors having a plurality of word lines, a plurality of bit lines, and a plurality of memristors.

Each memristor is located at a cross point of, and electrically coupled between, a respective word line and a respective bit line and configured to provide a respective memristor as a respective resistive element.

In some embodiments, the first resistor further includes a crossbar array of phase-change memory (PCM) memory cells having a plurality of word lines, a plurality of bit lines, and a plurality of PCM memory cells. Each PCM memory cell is located at a cross point of, and electrically coupled between, a respective word line and a respective bit line and configured to provide a respective PCM memory cell as a respective resistive element.

In some embodiments, the first resistor further includes a crossbar array of magnetoresistive memory cells having a plurality of word lines, a plurality of bit lines, and a plurality of magnetoresistive memory cells. Each magnetoresistive memory cell is located at a cross point of, and electrically coupled between, a respective word line and a respective bit line and configured to provide a respective magnetoresistive memory cell as a respective resistive element.

In yet another aspect of this application, an integrated circuit includes a plurality of resistors and one or more amplifiers coupled to the plurality of resistors. The plurality of resistors corresponds to a plurality of weights of a neural network and includes a first resistor corresponding to a first weight of the neural network. The one or more amplifiers and the plurality of resistors are configured to form a neural network circuit associated with the neural network, e.g., on a single semiconductor substrate. In some embodiments, the integrated circuit includes one or more of the elements described above for an electronic device.

Thus, methods, systems, and devices are disclosed that are used for hardware realization of trained neural networks.

BRIEF DESCRIPTION OF THE DRAWINGS

For a better understanding of the aforementioned systems, methods, and devices, as well as additional systems, methods, and devices that provide analog hardware realization of neural networks, reference should be made to the Description of Embodiments below, in conjunction with the following drawings in which like reference numerals refer to corresponding parts throughout the figures.

Reference will now be made to embodiments, examples of which are illustrated in the accompanying drawings. In the following description, numerous specific details are set forth in order to provide a thorough understanding of the present invention. However, it will be apparent to one of ordinary skill in the art that the present invention may be practiced without requiring these specific details.

DESCRIPTION OF EMBODIMENTS

Figure 1A:
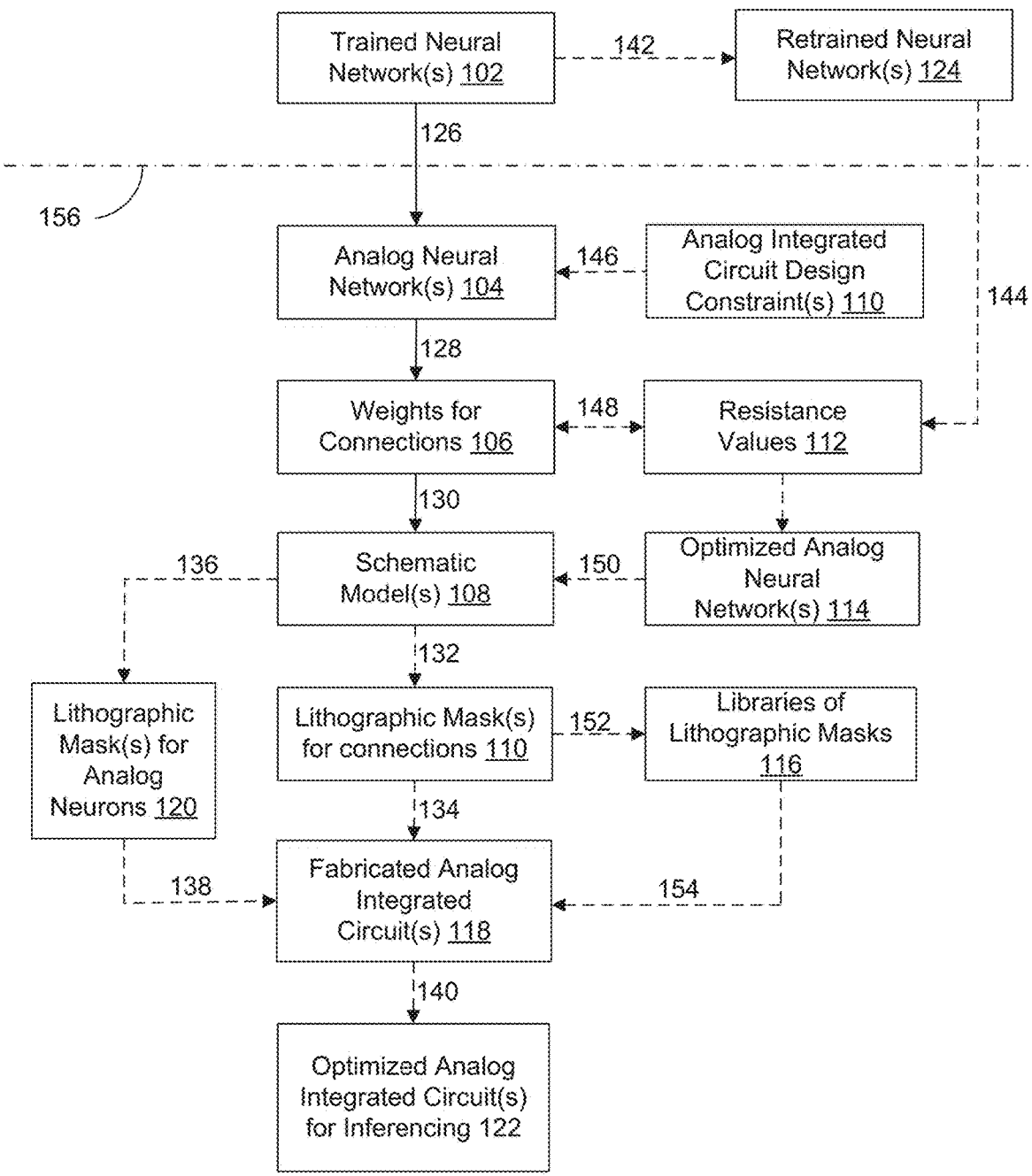
FIG. 1A is a block diagram of a system for hardware realization of trained neural networks using analog components, according to some embodiments.

FIG. 1A is a block diagram of a system 100 for hardware realization of trained neural networks using analog components, according to some embodiments. The system includes transforming (126) trained neural networks 102 to analog neural networks 104. In some embodiments, analog integrated circuit constraints 110 constrain (146) the transformation (126) to generate the analog neural networks 104. Subsequently, the system derives (calculates or generates) weights 106 for the analog neural networks 104 by a process that is sometimes called weight quantization (128). In some embodiments, the analog neural network includes a plurality of analog neurons, each analog neuron represented by an analog component, such as an operational amplifier, and each analog neuron is connected to other analog neurons via connections. In some embodiments, the connections are represented using resistors that reduce the current flow between two analog neurons. In some embodiments, the system transforms (148) the weights 106 to resistance values 112 for the connections. The system subsequently generates (130) one or more schematic models 108 for implementing the analog neural networks 104 based on the weights 106. In some embodiments, the system optimizes resistance values 112 (or the weights 106) to form optimized analog neural networks 114, which are further used to generate (150) the schematic models 108. In some embodiments, the system generates (132) lithographic masks 110 for the connections and/or generates (136) lithographic masks 120 for the analog neurons. In some embodiments, the system fabricates (134 and/or 138) analog integrated circuits 118 that implement the analog neural networks 104. In some embodiments, the system generates (152) libraries of lithographic masks 116 based on the lithographic masks 110 for connections and/or lithographic masks for analog neurons 120. In some embodiments, the system uses (154) the libraries of lithographic masks 116 to fabricate the analog integrated circuits 118. In some embodiments, when the trained neural networks 102 are retrained (142) to form update neural networks 124, the system regenerates (or recalculates) (144) the resistance values 112 (and/or the weights 106), the schematic model 108, and/or the lithographic masks 110 for connections. In some embodiments, the system reuses the lithographic masks 120 for the analog neurons 120. In other words, in some embodiments, only the weights 106 (or the resistance values 112 corresponding to the changed weights), and/or the lithographic masks 110 for the connections are regenerated. Since only the connections, the weights, the schematic model, and/or the corresponding lithographic masks for the connections are regenerated, as indicated by the dashed line 156, the process for (or the path to) fabricating analog integrated circuits for the retrained neural networks is substantially simplified, and the time to market for re-spinning hardware for neural networks is reduced, when compared to conventional techniques for hardware realization of neural networks. In some embodiments, an optimization pass (140) constructs optimized analog integrated circuits (122) for inferencing.

Figure 1B:
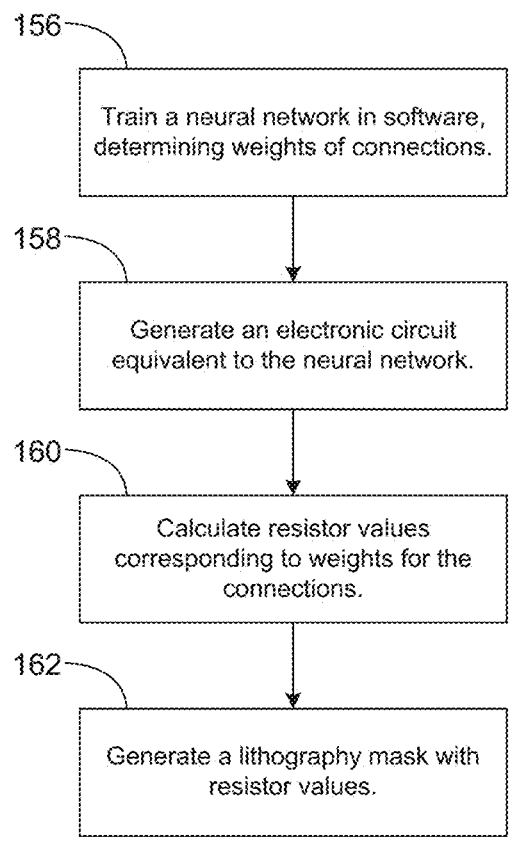
FIG. 1B is a block diagram of an alternative representation of the system of FIG. 1A for hardware realization of trained neural networks using analog components, according to some embodiments.

FIG. 1B is a block diagram of an alternative representation of the system 100 for hardware realization of trained neural networks using analog components, according to some embodiments. The system includes training (156) neural networks in software, determining weights of connections, generating (158) electronic circuit equivalent to the neural network, calculating (160) resistor values corresponding to weights of each connection, and subsequently generating (162) lithography mask with resistor values.

The techniques described herein can be used to design and/or manufacture an analog neuromorphic integrated circuit that is mathematically equivalent to a trained neural network (either feed-forward or recurrent neural networks). According to some embodiments, the process begins with a trained neural network that is first converted into a transformed network comprised of standard elements. Operation of the transformed network are simulated using software with known models representing the standard elements. The software simulation is used to determine the individual resistance values for each of the resistors in the transformed network. Lithography masks are laid out based on the arrangement of the standard elements in the transformed network. Each of the standard elements are laid out in the masks using an existing library of circuits corresponding to the standard elements to simplify and speed up the process. In some embodiments, the resistors are laid out in one or more masks separate from the masks including the other elements (e.g., operational amplifiers) in the transformed network. In this manner, if the neural network is retrained, only the masks containing the resistors, or other types of fixed-resistance elements, representing the new weights in the retrained neural network need to be regenerated, which simplifies and speeds up the process. The lithography masks are then sent to a fab for manufacturing the analog neuromorphic integrated circuit.

In some embodiments, components of the system 100 described above are implemented in one or more computing devices or server systems as computing modules.

Figure 2A:
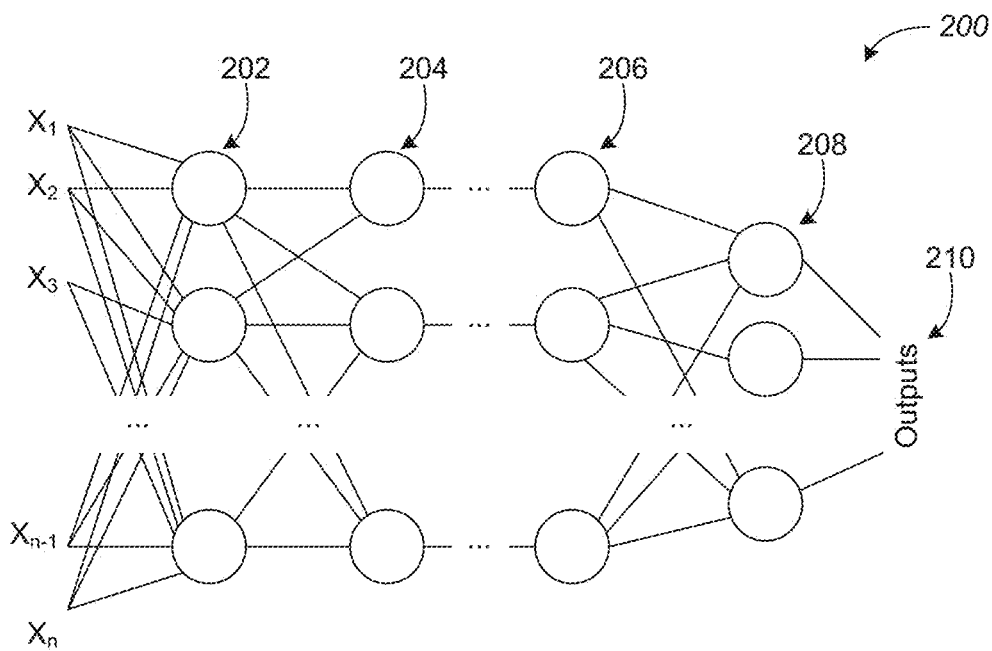
FIGS. 2A, 2B, and 2C are examples of trained neural networks that are input to a system and transformed to mathematically equivalent analog networks, according to some embodiments.
Figure 2B:
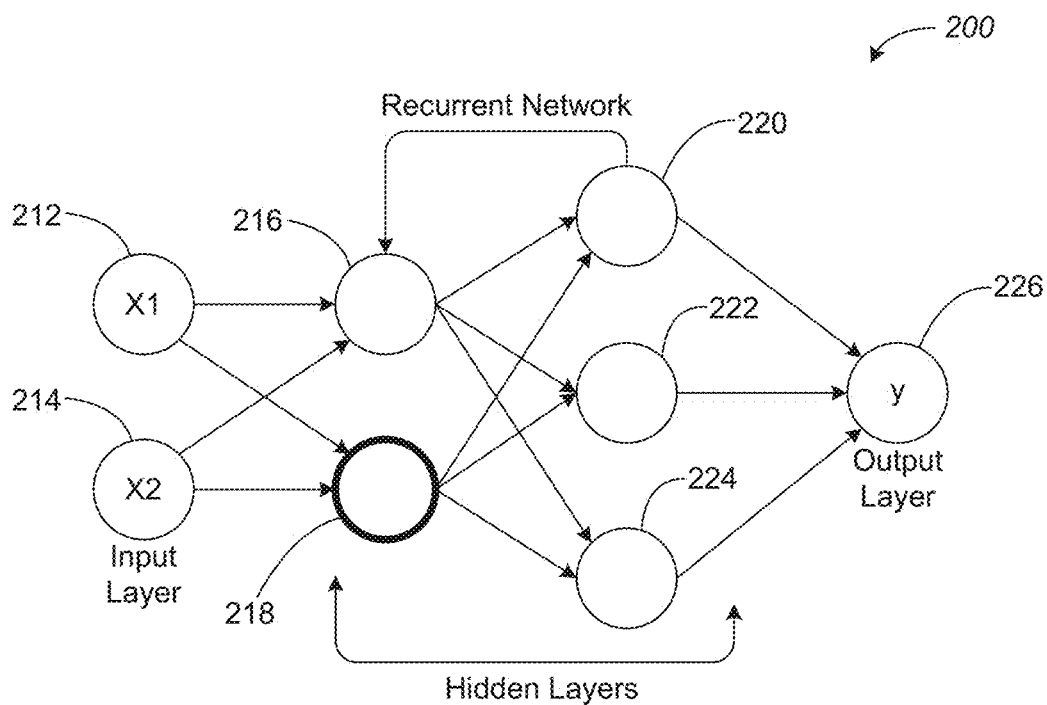
Figure 2C:
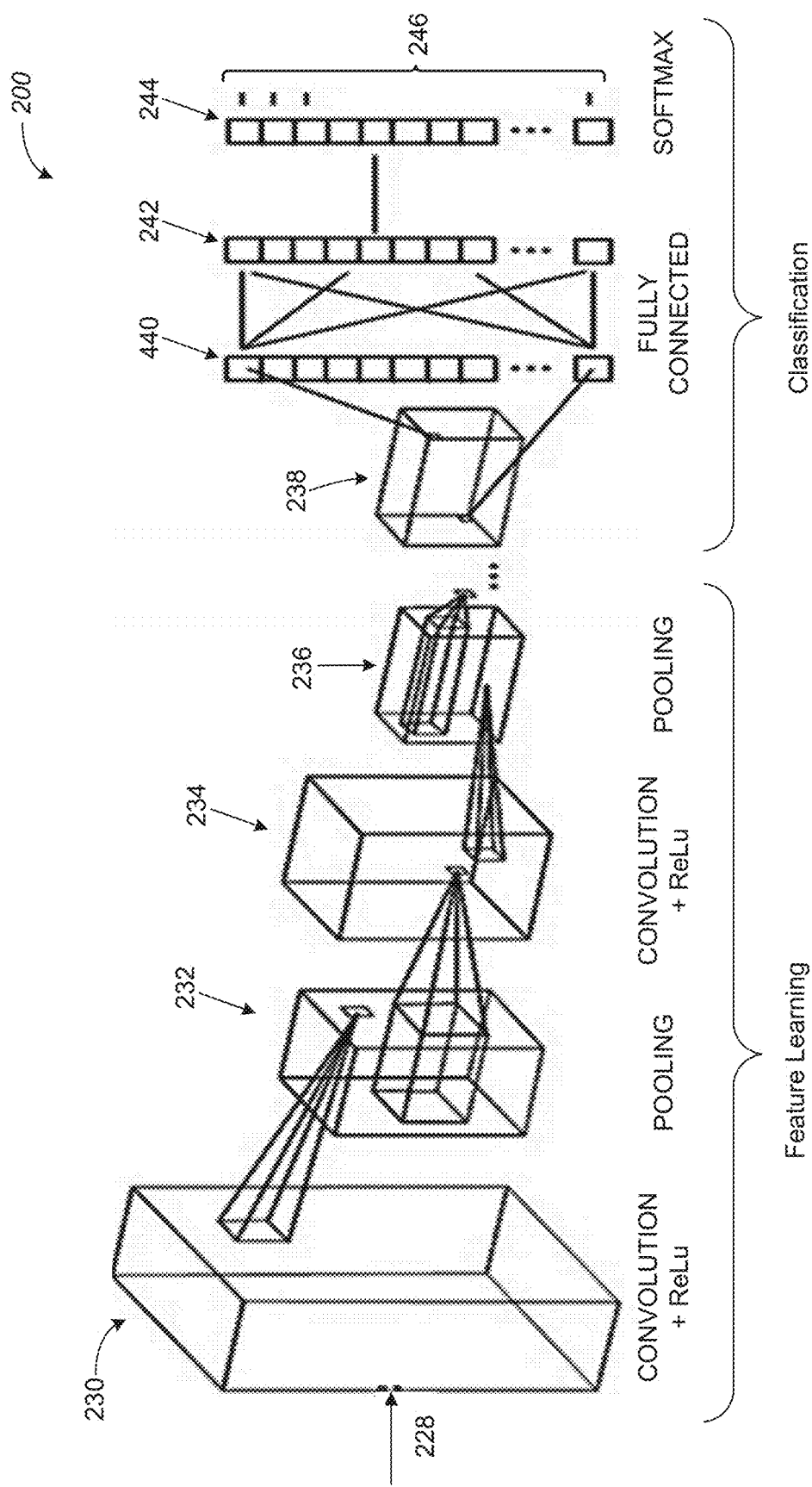

FIGS. 2A, 2B, and 2C show examples of trained neural networks 200 that are input to the system 100 and transformed to mathematically equivalent analog networks, according to some embodiments. FIG. 2A shows an example neural network 200 (sometimes called an artificial neural network) that are composed of artificial neurons that receive input, combine the input using an activation function, and produce one or more outputs. The input includes data, such as images, sensor data, and documents. Typically, each neural network performs a specific task, such as object recognition. The networks include connections between the neurons, each connection providing the output of a neuron as an input to another neuron. After training, each connection is assigned a corresponding weight. As shown in FIG. 2A, the neurons are typically organized into multiple layers, with each layer of neurons connected only to the immediately preceding and following layer of neurons. An input layer of neurons 202 receives external input (e.g., the input $X_1, X_2, \ldots, X_n$). The input layer 202 is followed by one or more hidden layers of neurons (e.g., the layers 204 and 206), that is followed by an output layer 208 that produces outputs 210. Various types of connection patterns connect neurons of consecutive layers, such as a fully-connected pattern that connects every neuron in one layer to all the neurons of the next layer, or a pooling pattern that connect output of a group of neurons in one layer to a single neuron in the next layer. In contrast to the neural network shown in FIG. 2A that are sometimes called feedforward networks, the neural network shown in FIG. 2B includes one or more connections from neurons in one layer to either other neurons in the same layer or neurons in a preceding layer. The example shown in FIG. 2B is an example of a recurrent neural network, and includes two input neurons 212 (that accepts an input X1) and 214 (that accepts an input X2) in an input layer followed by two hidden layers. The first hidden layer includes neurons 216 and 218 that is fully connected with neurons in the input layer, and the neurons 220, 222, and 224 in the second hidden layer. The output of the neuron 220 in the second hidden layer is connected to the neuron 216 in the first hidden layer, providing a feedback loop. The hidden layer including the neurons 220, 222, and 224 are input to a neuron 226 in the output layer that produces an output y.

FIG. 2C shows an example of a convolutional neural network (CNN), according to some embodiments. In contrast to the neural networks shown in FIGS. 2A and 2B, the example shown in FIG. 2C includes different types of neural network layers, that includes a first stage of layers for feature learning, and a second stage of layers for classification tasks, such as object recognition. The feature learning stage includes a convolution and Rectified Linear Unit (ReLU) layer 230, followed by a pooling layer 232, that is followed by another convolution and ReLU layer 234, which is in turn followed by another pooling layer 236. The first layer 230 extracts features from an input 228 (e.g., an input image or portions thereof), and performs a convolution operation on its input, and one or more non-linear operations (e.g., ReLU, tan h, or sigmoid). A pooling layer, such as the layer 232, reduces the number of parameters when the inputs are large. The output of the pooling layer 236 is flattened by the layer 238 and input to a fully connected neural network with one or more layers (e.g., the layers 240 and 242). The output of the fully-connected neural network is input to a softmax layer 244 to classify the output of the layer 242 of the fully-connected network to produce one of many different output 244 (e.g., object class or type of the input image 228).

Some embodiments store the layout or the organization of the input neural networks including number of neurons in each layer, total number of neurons, operations or activation functions of each neuron, and/or connections between the neurons, in the memory 214, as the neural network topology 224.

Figure 3:
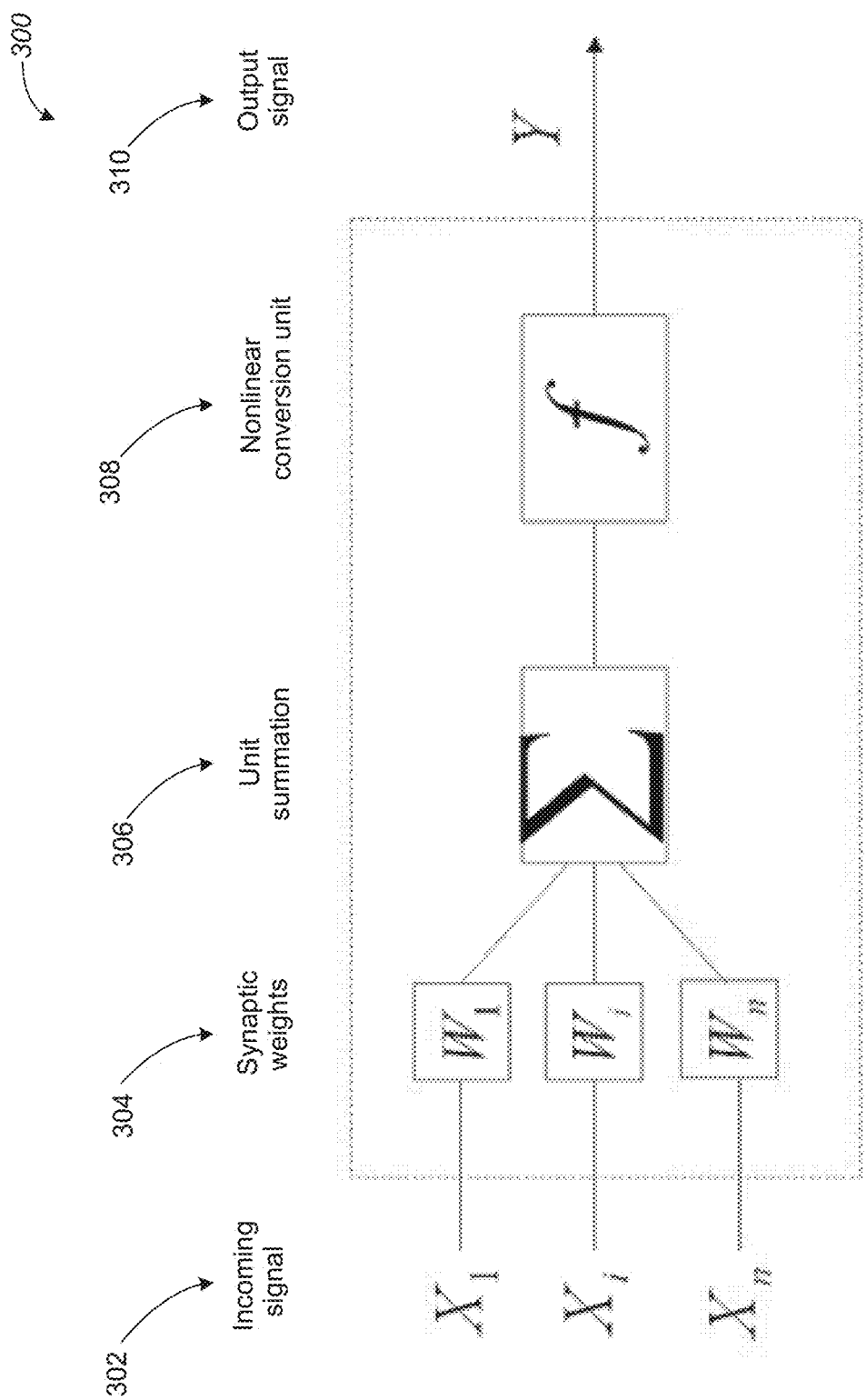
FIG. 3 shows an example of a math model for a neuron, according to some embodiments.

FIG. 3 shows an example of a math model 300 for a neuron, according to some embodiments. The math model includes incoming signals 302 input multiplied by synaptic weights 304 and summed by a unit summation 306. The result of the unit summation 306 is input to a nonlinear conversion unit 308 to produce an output signal 310, according to some embodiments.

In some embodiments, the example computations described herein are performed by a weight matrix computation or weight quantization module (e.g., using a resistance calculation module) that compute the weights for connections of the transformed neural networks, and/or corresponding resistance values for the weights.

This section describes an example process for quantizing resistor values corresponding to weights of a trained neural network, according to some embodiments. The example process substantially simplifies the process of manufacturing chips using analog hardware components for realizing neural networks. As described above, some embodiments use resistors to represent neural network weights and/or biases for operational amplifiers that represent analog neurons. The example process described here specifically reduces the complexity in lithographically fabricating sets of resistors for the chip. With the procedure of quantizing the resistor values, only select values of resistances are needed for chip manufacture. In this way, the example process simplifies the overall process of chip manufacture and enables automatic resistor lithographic mask manufacturing on demand.

Figure 4:
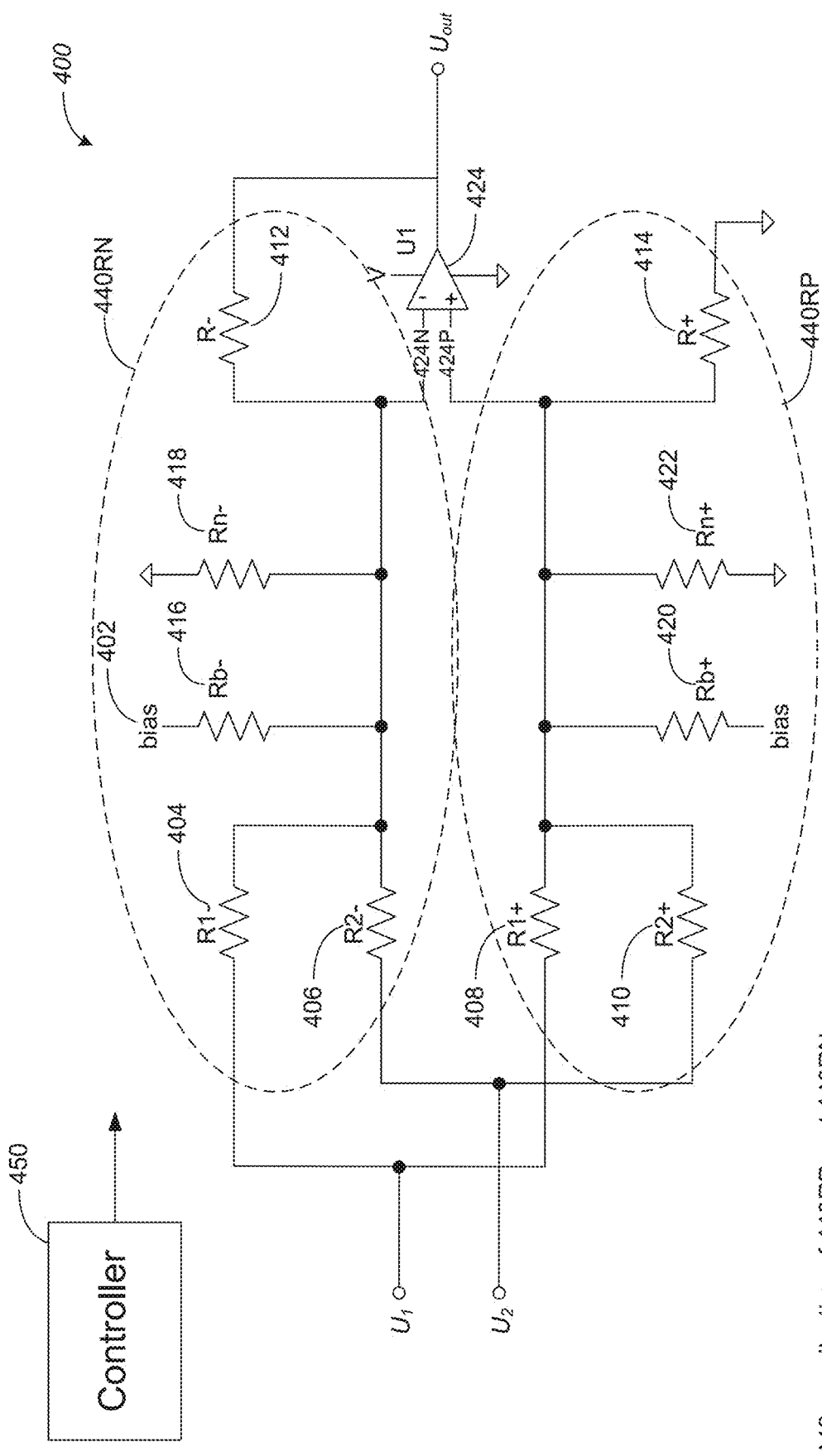
FIG. 4 is a schematic diagram of an example neuron circuit for a neuron of a neural network used for resistor quantization, according to some embodiments.

FIG. 4 is a schematic diagram of an example neuron circuit 400 for a neuron of a neural network used for resistors quantization, according to some embodiments. In some embodiments, the neuron circuit 400 is based on an operational amplifier 424 (e.g., AD824 series precision amplifier) that receives input signals $U_1$ and $U_2$ from a set of negative weight resistors 440RN (R1– 404, R2– 406, Rb– bias 416, Rn– 418, and R– 412) and a set of positive weight resistors 440RP (R1+ 408, R2+ 410, Rb+ bias 420, Rn+ 422, and R+ 414). The positive and negative weight resistors 440RP and 440RN are collectively called weight resistors 440. The positive weight resistors 440RP are coupled to a positive input 424P of the operational amplifier 424, and the positive weight resistors 440RP are coupled to a negative input 424N of the operational amplifier 424. The weight resistors 440 form a feedback network for the operational amplifier 424, allowing the operational amplifier 424 to implement a weighted summation operation on the input signals $U_1$ and $U_2$. The positive weighting resistors 440RP correspond to positive weights of the neuron corresponding to the neuron circuit 400, and the negative weighting resistors 440RN correspond to negative weights of the neuron corresponding to the neuron circuit 400. In some embodiments, the operational amplifier 424 is configured to combine the input signal $U_1$ and $U_2$ to facilitate normal circuit operation, e.g., linearly, and the output signal $U_{out}$ is outputted in a nominal voltage range between two power supplies of operational amplifier 424. In some embodiments, the operational amplifier 424 accomplishes ReLU transformation of the output signal $U_{out}$ at its output cascade.

Stated another way, in some embodiments, a neural network includes a plurality of layers each of which includes a plurality of neurons. The neural network is implemented using an analog circuit including a plurality of resistors 440 and a plurality of amplifiers 424, and each neuron is implemented using at least a subset of resistors (e.g., positive weighting resistors 440RP and negative weighting resistors 440RN) and one or more amplifiers (e.g., amplifier 424). The neuron circuit 400 includes a combination circuit including an operational amplifier 424, a subset of resistors 440, two or more input interfaces, and an output interface. The combination circuit is configured to obtain two or more input signals (e.g., $U_1$ and $U_2$) at the two or more input interfaces, combine the two or more input signals (e.g., in a substantially linear manner), and generate an output $U_{out}$. Broadly, the two or more input signals includes a number N of signals, and is linearly combined to generate the output $U_{out}$ as follows:

$$U_{out} = \sum_{i=1}^{N}\left(\frac{R^+}{R_i^+} - \frac{R^-}{R_i^-}\right)U_i. \quad (1)$$

For each input signal $U_i$, a corresponding weight $w_i$ is determined based on resistance of the subset of resistors 440 as follows:

$$w_i = \frac{R^+}{R_i^+} - \frac{R^-}{R_i^-}. \quad (2)$$

For example, referring to FIG. 4, the neuron model 400 receives two input signals $U_1$ and $U_2$, and linearly combines the input signals $U_1$ and $U_2$ to generate an output $U_{out}$. Weights applied to combine the input signals $U_1$ and $U_2$ are determined based on resistances of the resistors 400RP and 400RN used in the neuron circuit 400. The output $U_{out}$ and the weights $w_1$ and $w_2$ are determined as follows:

$$U_{out} = w_1 U_1 + w_2 U_2. \quad (3)$$

For each input signal $U_i$, a corresponding weight $w_i$ is determined as follows:

$$w_1 = \frac{R^+}{R_1^+} - \frac{R^-}{R_1^-} \text{ and } w_2 = \frac{R^+}{R_2^+} - \frac{R^-}{R_2^-}. \quad (4)$$

In some embodiments, the following optimization procedure is applied to quantize resistance values of each resistance and minimize an error of the output $U_{out}$:

1. Obtain a set of connection weights and biases {w1, . . . , wn, b};
2. Obtain possible minimum and maximum resistor values {Rmin, Rmax}, which are determined based on the technology used for manufacturing;
3. Assume that each resistor has r_err relative tolerance value;
4. Select a set of resistor values {R1, . . . , Rn} of given length N within the defined [Rmin; Rmax], based on {w1, . . . , wn, b} values, where an example search algorithm is provided below to find sub-optimal {R1, . . . , Rn} set based on particular optimality criteria; and
5. Apply another algorithm to choose {Rn, Rp, Rni, Rpi} for a network given that {R1 . . . Rn} is determined.

Some embodiments use TaN or Tellurium high resistivity materials. In some embodiments, the minimum value Rmin of resistor 440 is determined by minimum square that can be formed lithographically. The maximum value Rmax is determined by length, allowable for resistors (e.g., resistors made from TaN or Tellurium) to fit to the desired area, which is in turn determined by the area of an operational amplifier square on lithographic mask. In some embodiments, the area of arrays of resistors 440RN and 440PR is formed in back end of line (BEOL), which allows the arrays of resistors are stacked, and is smaller in size than the area of the operational amplifier 424 formed in front end of line (FEOL).

Some embodiments use an iterative approach for resistor set search. Some embodiments select an initial (random or uniform) set {R1, . . . , Rn} within the defined range. Some embodiments select one of the elements of the resistor set as a R−=R+ value. Some embodiments alter each resistor within the set by a current learning rate value until such alterations produce 'better' set (according to a value function). This process is repeated for all resistors within the set and with several different learning rate values, until no further improvement is possible.

In some embodiments, a value function of a resistor set is defined. Specifically, possible weight options are calculated for each weight $w_i$ according to equation (2). Expected error value for each weight option is estimated based on potential resistor relative error r_err determined by IC manufacturing technology. Weight options list is limited or restricted to [−wlim; wlim] range. Some values, which have expected error beyond a high threshold (e.g., 10 times r_err), are eliminated. The value function is calculated as a square mean of distance between two neighboring weight options. In an example, the weight options are distributed uniformly within [−wlim; wlim] range, and the value function is minimal.

In an example, the required weight range [−wlim; wlim] for a neural network is set to [−5, 5], and the other parameters include N=20, r_err=0.1%, rmin=100 KΩ, rmax=5 MΩ. Here, rmin and rmax are minimum and maximum values for resistances, respectively.

In one instance, the following resistor set of length 20 was obtained for abovementioned parameters: [0.300, 0.461, 0.519, 0.566, 0.648, 0.655, 0.689, 0.996, 1.006, 1.048, 1.186, 1.222, 1.261, 1.435, 1.488, 1.524, 1.584, 1.763, 1.896, 2.02] MΩ. Resistances of both resistors R− and R+ are equal to 1.763 MΩ.

Some embodiments determine Rn and Rp using an iterative algorithm such as the algorithm described above. Some embodiments set Rp=Rn (the tasks to determine Rn and Rp are symmetrical—the two quantities typically converge to a similar value). Then for each weight $w_i$, some embodiments select a pair of resistances {Rni, Rpi} that minimizes the estimated weight error value:

$$w_{err} = \left(\frac{R^+}{R_i^+} + \frac{R^-}{R_i^-}\right) \cdot r_{err} + \left|w_i - \frac{R^+}{R_i^+} + \frac{R^-}{R_i^-}\right| \quad (5)$$

Some embodiments subsequently use the {Rni; Rpi; Rn; Rp} values set to implement neural network schematics. In one instance, the schematics produced mean square output error (sometimes called S mean square output error, described above) of 11 mV and max error of 33 mV over a set of 10,000 uniformly distributed input data samples, according to some embodiments. In one instance, S model was analyzed along with digital-to-analog converters (DAC), analog-to-digital converters (ADC), with 256 levels as a separate model. The S model produces 14 mV mean square output error and 49 mV max output error on the same data set, according to some embodiments. DAC and ADC have levels because they convert analog value to bit value and vice-versa. 8 bits of digital value is equal to 256 levels. Precision cannot be better than 1/256 for 8-bit ADC.

Some embodiments calculate the resistance values for analog IC chips, when the weights of connections are known, based on Kirchhoff's circuit laws and basic principles of operational amplifiers (described below in reference to FIG. 5), using Mathcad or any other similar software. In some embodiments, operational amplifiers are used both for amplification of signal and for transformation according to the activation functions (e.g., ReLU, sigmoid, Tangent hyperbolic, or linear mathematical equations), Some embodiments manufacture resistors in a lithography layer where resistors are formed as cylindrical holes in the $SiO_2$ matrix, and the resistance value is set by the diameter of hole. Some embodiments use amorphous TaN, TiN of CrN or Tellurium as the highly resistive material to make high density resistor arrays. Some ratios of Ta to N Ti to N and Cr to N provide high resistance for making ultra-dense high resistivity elements arrays. For example, for TaN, $Ta_5N_6$, $Ta_3N_5$, the higher the N ratio to Ta, the higher is the resistivity. Some embodiments use $Ti_2N$, TiN, CrN, or $Cr_5N$, and determine the ratios accordingly. TaN deposition is a standard procedure used in chip manufacturing and is available at all major Foundries.

In some embodiments, a subset of weight resistors 440 have variable resistance. For example, the subset of weight resistors 440 includes resistors R+ 414, R2+ 410, and R1− 404. Further, in some embodiments, a neural network includes a plurality of neural layers, and the subset of weight resistors 440 having variable resistance are applied to implement neurons in a subset of neural layers that is directly coupled to an output of the neural network. For example, the neural network has more than 10 layers, and weight resistors 440 having variable resistance is used to implement one or more neurons in the last one or two layers of the neural network. More details on resistor-based weight adjustment in the neuron circuit 400 are explained below with reference to FIGS. 6A-10.

Figure 5:
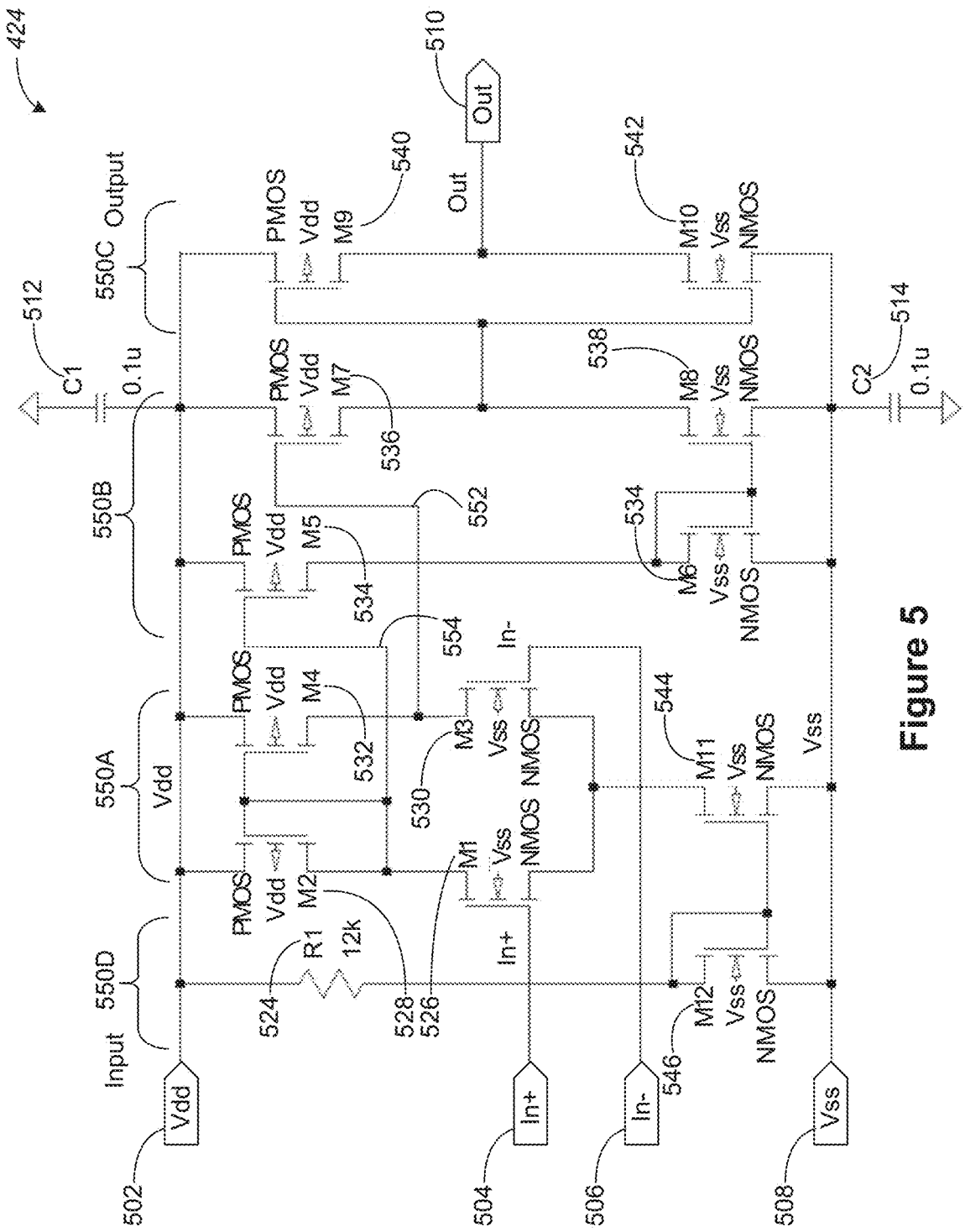
FIG. 5 is a schematic diagram of an example operational amplifier, according to some embodiments.

FIG. 5 is a schematic diagram of an example operational amplifier 424, according to some embodiments. In some embodiments, the operational amplifier 424 is applied to form the neuron circuit 400 shown in FIG. 4. The operational amplifier 424 is coupled to a feedback network including a set of negative weight resistors 440RN and a set of positive weight resistors 440RP, forming the neuron circuit 400 configured to combine a plurality of input signals $U_i$ (e.g., $U_1$ and $U_2$) and generate an output $U_{out}$. The operational amplifier 424 includes a two-stage amplifier having N-type different inputs. The differential inputs include a positive input 504 (In+) and a negative input 506 (In−). The operational amplifier 424 is powered by two power supplies, e.g., a positive supply voltage 502 (Vdd), a negative supply voltage 508 (Vss) or a ground GND.

The operational amplifier 424 includes a plurality of complementary metal-oxide semiconductor (CMOS) transistors (e.g., having both P-type transistors and N-type transistors). In some embodiments, performance parameters of each CMOS transistor (e.g., drain current $I_D$) are determined by a ratio of geometric dimensions: W (a channel width) to L (a channel length) of the respective CMOS transistor. The operational amplifiers 424 includes one or more of a differential amplifier stage 550A, a second amplifier stage 550B, an output stage 550C, and a biasing stage 550D. Each circuit stage of the operational amplifier 424 is formed based on a subset of the CMOS transistors.

A biasing stage 550D includes NMOS transistor M12 546 and resistor R1 521 (with an example resistance value of 12 kΩ), and is configured to generate a reference current. A current mirror is formed based on NMOS transistors M11 544 and M12 546, and provides an offset current to the differential pair (M1 526 and M3 530) based on the reference current of the biasing stage 550D. The differential amplifier stage 550A (differential pair) includes NMOS transistors M1 526 and M3 530. Transistors M1, M3 are amplifying, and PMOS transistors M2 528 and M4 532 play a role of active current load. A first amplified signal 552 is outputted from a drain of transistor M3 530, and provided to drive a gate of PMOS transistor M7 536 of a second amplifier stage 500B. A second amplified signal 554 is outputted from a drain of transistor M1 526, and provided to drive a gate of PMOS transistor M5 (inverter) 534, which is an active load on the NMOS transistor M6 534. A current flowing through the transistor M5 534 is mirrored to the NMOS transistor M8 538. Transistor M7 536 is included with a common source for a positive half-wave signal. The M8 transistor 538 is enabled by a common source circuit for a negative half-wave signal. The output stage 550C of the operational amplifier 424 includes P-type transistor M9 540 and N-type transistor M10 542, and is configured to increase an overall load capacity of the operational amplifier 424. In some embodiments, a plurality of capacitors (e.g., C1 512 and C2 514) is coupled to the power supplies 502 and 508, and configured to reduce noise coupled into the power supplies and stabilize the power supplies 502 and 508 for the operational amplifier 424.

In some embodiments, an electronic device includes a plurality of resistors 440RN and 440RP and one or more amplifiers 424 coupled to the plurality of resistors 440RN and 440RP. In some embodiments, the one or more amplifiers 424 and the plurality of resistors 440RN and 440RP are formed on a substrate of an integrated circuit. In some embodiments, the integrated circuit implementing the neural network is packaged and used in an electronic device as a whole. Conversely, in some embodiments, at least one of the one or more amplifiers 424 is formed on an integrated circuit, and packaged and integrated on a printed circuit board (PCB) with remaining resistors or amplifiers of the same neural network. In some embodiments, the plurality of resistors 440RN and 440RP and the one or more amplifiers 424 of the same neural network are formed on two or more separate integrated circuit substrates, which are packaged separately and integrated on the same PCB to form the electronic device. Two or more packages of the electronic device are configured to communicate signals with each other and implement the neural network collaboratively.

Analog circuits that model trained neural networks and manufactured according to the techniques described herein, can provide improved performance per watt advantages, can be useful in implementing hardware solutions in edge environments, and can tackle a variety of applications, such as drone navigation and autonomous cars. The cost advantages provided by the proposed manufacturing methods and/or analog network architectures are even more pronounced with larger neural networks. Also, analog hardware embodiments of neural networks provide improved parallelism and neuromorphism. Moreover, neuromorphic analog components are not sensitive to noise and temperature changes, when compared to digital counterparts.

Chips manufactured according to the techniques described herein provide order of magnitude improvements over conventional systems in size, power, and performance, and are ideal for edge environments, including for retraining purposes. Such analog neuromorphic chips can be used to implement edge computing applications or in Internet-of-Things (IoT) environments. Due to the analog hardware, initial processing (e.g., formation of descriptors for image recognition), that can consume over 80-90% of power, can be moved on chip, thereby decreasing energy consumption and network load that can open new markets for applications.

Various edge applications can benefit from use of such analog hardware. For example, for video processing, the techniques described herein can be used to include direct connection to CMOS sensor without digital interface. Various other video processing applications include road sign recognition for automobiles, camera-based true depth and/or simultaneous localization and mapping for robots, room access control without server connection, and always-on solutions for security and healthcare. Such chips can be used for data processing from radars and lidars, and for low-level data fusion. Such techniques can be used to implement battery management features for large battery packs, sound/voice processing without connection to data centers, voice recognition on mobile devices, wake up speech instructions for IoT sensors, translators that translate one language to another, large sensors arrays of IoT with low signal intensity, and/or configurable process control with hundreds of sensors.

Neuromorphic analog chips can be mass produced after standard software-based neural network simulations/training, according to some embodiments. A client's neural network can be easily ported, regardless of the structure of the neural network, with customized chip design and production. Moreover, a library of ready to make on-chip solutions (network emulators) are provided, according to some embodiments. Such solutions require only training, one lithographic mask change, following which chips can be mass produced. For example, during chip production, only part of the lithography masks need to be changed.

Figure 6A:
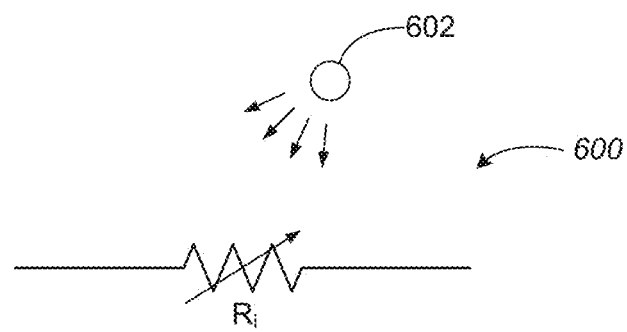
FIGS. 6A-6C are schematic diagrams of an example variable resistor applied in a neuron circuit, according to some embodiments.
Figure 6B:
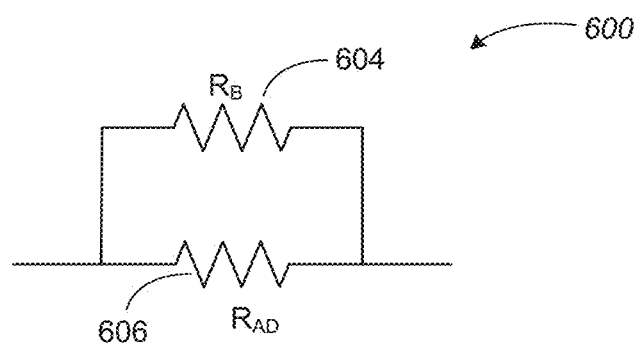
Figure 6C:
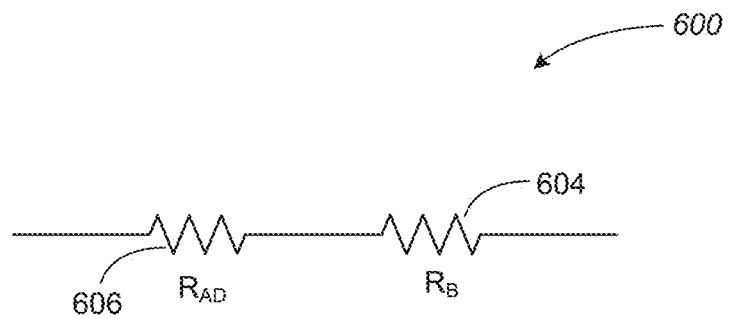

FIGS. 6A-6C are schematic diagrams of an example variable resistor 600 applied in a neuron circuit 400, according to some embodiments. An operational amplifier 424 is applied to form a neuron circuit 400 (FIG. 4) corresponding to a neuron of a neural network (e.g., neuron 218 in FIG. 2B). The operational amplifier 424 is coupled to a feedback network including a set of negative weight resistors 440RN and a set of positive weight resistors 440RP, forming the neuron circuit 400 configured to combine a plurality of input signals $U_i$ (e.g., $U_1$ and $U_2$) and generate an output $U_{out}$. The weighting resistors 440R (i.e., a combination of 440RN and 440RP) correspond to a plurality of weights associated with the neuron of the neural network. An example of a correlation of a weight $w_i$ and a subset of the weighting resistors 440RN and 440RP is represented in equation (2). In some embodiments, at least one of the weighting resistors 440R includes a variable resistor 600 having variable resistance. Specifically, in some embodiments, the variable resistor 600 is configured to have a first resistance and a second resistance. A controller 450 (FIG. 4) is coupled to the neuron circuit 400 and configured to determine a weight corresponding to the variable resistor 600 has a first value or a second value. In accordance with a determination that the first weight of the neural network has a first value, the controller 450 controls the variable resistor 600 to provide the first resistance. In accordance with a determination that the first weight of the neural network has a second value, the controller 450 controls the variable resistor 600 to provide the second resistance.

In some embodiments, referring to FIG. 6A, the variable resistor 600 includes at least one photoresistor. The photoresistor is configured to be exposed to a controllable source of light 602. The variable resistance of the variable resistor 600 depends on a brightness level of the controllable source of light. Further, in some embodiments, the photo resistor includes one or more of: cadmium sulfide (CdS), cadmium selenide (CdSe), lead sulfide (PbS) and indium antimonide (InSb), and titanium oxide ($TiO_2$). In some embodiments, the variable resistor 600 includes a photosensitive component (e.g., a photosensitive transistor coupled as a resistive component), which is configured to be exposed to a controllable source of light 602 and provide the variable resistance based on a brightness level of the controllable source of light.

In some embodiments (FIG. 6B), the variable resistor 600 includes at least a base resistor 604 and an adjustment resistor 606. In accordance with a determination that a first weight of the neural network has a first value, the controller 450 controls the base resistor 604 to act as a corresponding weight resistor 440 and provide first resistance by itself. In accordance with a determination that the first weight of the neural network has a second value, the controller 450 controls the base resistor 604 to couple to the adjustment resistor 606 to provide the second resistance. Specifically, in some embodiments (FIG. 6B), the second resistance is less than the first resistance. The adjustment resistor 606 is coupled in parallel with the base resistor 604 to reduce the resistance of the corresponding weight resistor 440. Alternatively, in some embodiments (FIG. 6C), the second resistance is greater than the first resistance. The adjustment resistor 606 is coupled in series with the base resistor 604 to increase the resistance of the corresponding weight resistor 440. In some embodiments, the adjustment resistor 606 has fixed resistance. In some embodiments, the adjustment resistor 606 has variable resistance.

In some embodiments, each weight $w_i$ of the plurality of weights of the neuron corresponds to a subset of weighting resistors 440R. Two distinct subsets of weighting resistor 440R corresponding to two distinct weights of the plurality of weights of the neuron include one or more common resistors $R_C$. A resistance change of the one or more common resistors $R_C$ causes both of the two distinct weights of the plurality of weights to vary concurrently. Conversely, a resistance change of any remaining resistor distinct from the common resistor(s) $R_C$ causes only one of the two distinct weights to vary independently of the other one of the two distinct weights. For example, based on equation (4), weights $w_1$ and $w_2$ correspond to both resistors R+ 414 and R− 412. In some embodiments, one of the resistors R+ 414 and R− 412 includes the variable resistor 600 having variable resistance, and is configured to adjust the weights $w_1$ and $w_2$ jointly. In some embodiments, one of the resistors R1+ 408 and R1− 404 includes the variable resistor 600 having variable resistance, and is configured to adjust the weight $w_1$, independently of weight $w_2$. In some embodiments, one of the resistors R2+ 410 and R2− 406 includes the variable resistor 600 having variable resistance, and is configured to adjust the weight $w_2$, independently of weight $w_1$.

Alternatively, in some embodiments, each weight $w_i$ of the plurality of weights of the neuron corresponds to a subset of respective weighting resistors 440R, and no resistor 440 of the subset of respective weighting resistors 440 corresponds to two or more weights of the neuron. Each weight $w_i$ of the plurality of weights of the neuron is adjustable independently based on the subset of weighting resistors 440, without impacting any remaining weight of the plurality of weights of the neuron. In some embodiments, one or more weighting resistors 440 are implemented to have variable resistance, and each of the one or more weighting resistors 440 includes a respective variable resistor 600.

In some embodiments, a neural network includes a large number of layers, i.e., a number of layers of the neural network exceeds a predefined threshold layer number NTH. In some embodiments, a plurality of neural layers of the neural network further includes a subset of output neural layers that is directly coupled to an output of the neural network, and the subset of output neural layers includes a weight that changes after re-training of the neural network. The weight corresponds to one or more variable resistors 600 in a corresponding neural network circuit that implements the neural network. Stated another way, in some situations, re-training only impacts weights in the last few layers of a large neural network, and the variable resistor 600 is used in the neuron circuit 400 corresponding to neurons in the last few layers of such a large neural network.

Figure 7:
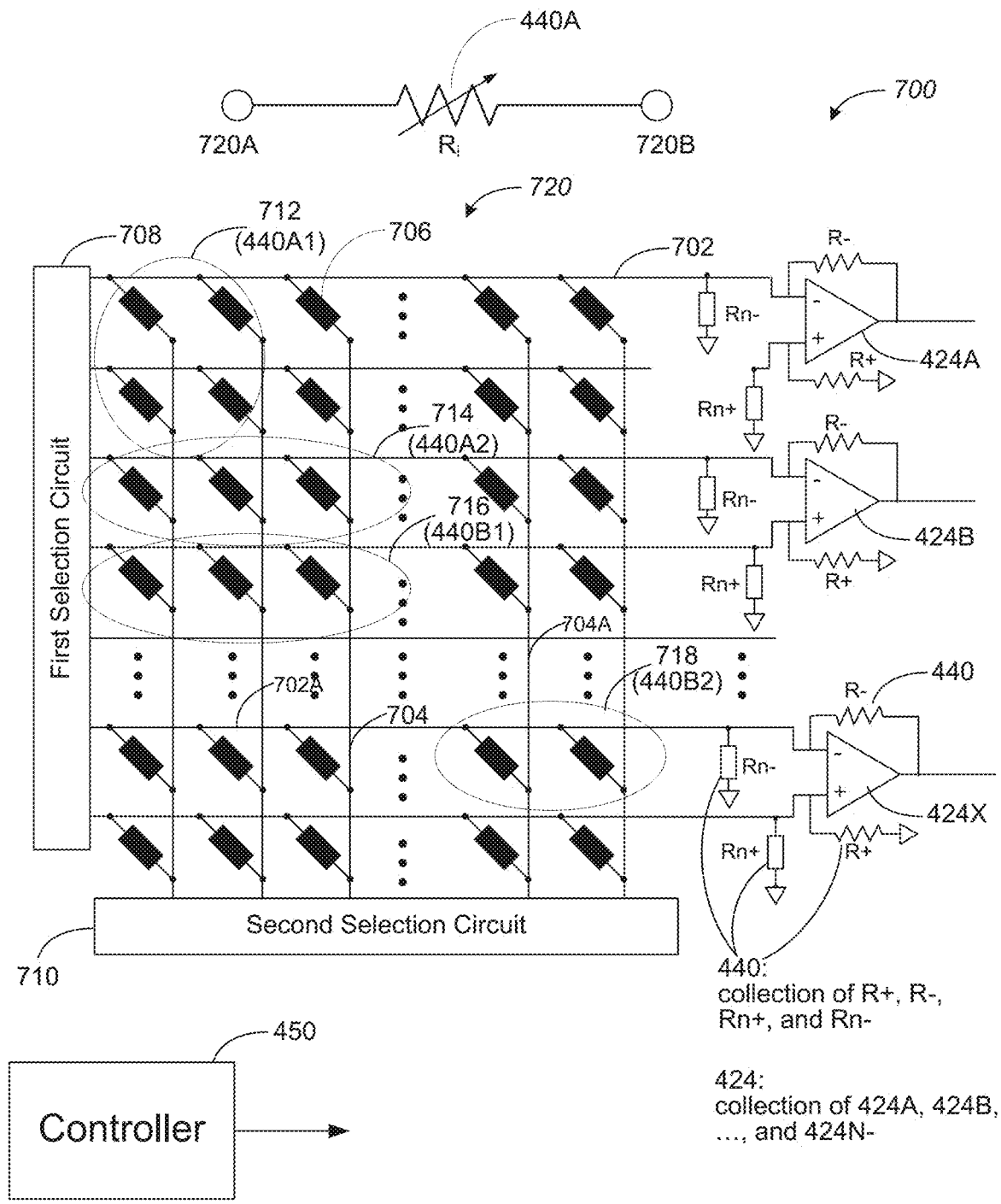
FIG. 7 is a schematic diagram of an example neural network circuit for implementing a neural network, in accordance with some embodiments.

FIG. 7 is a schematic diagram of an example neural network circuit 700 for implementing a neural network based on a crossbar array 720 of resistive elements, in accordance with some embodiments. A plurality of amplifiers 424 (e.g., 424A, 424B, . . . 424X) is coupled to a plurality of weight resistors 440 (e.g., resistors R+, R−, Rn+, and Rn− coupled to each amplifier 424) to form the neural network circuit 700. An example of the neural network that can be similarly implemented by the neural network circuit 700 is a neural network 200 in FIG. 2A. In some embodiments, each amplifier 424 corresponds to a respective neuron of the neural network, and a weighted linear combination operation is implemented via the amplifier 424 and a feedback network that is formed by the plurality of weight resistors 440 and coupled to the respective amplifier 424. The plurality of weight resistors 440 correspond to a plurality of weights of the neural network. In some embodiments, the plurality of weight resistors 440 further includes a first resistor 440A formed based on a crossbar array 720 of resistive elements. In some embodiments, the first resistor 440A includes at least a variable resistor 600 corresponding to one of a plurality of weights of the neural network. The variable resistor 600 includes the crossbar array 720 of resistive elements. Further, in some embodiments, the first resistor 440A further includes a base resistor 604, and the crossbar array 720 of resistive elements is optionally coupled in series or in parallel with the base resistor 604 to increase or decrease resistance of the first resistor 440A. Alternatively, in some embodiments, the crossbar array 720 of resistive elements provides one or more additional weight resistors 440 in addition to the first resistor 440A. The one or more additional weight resistors 440 and the first resistor 440A optionally correspond to different weights of the same neuron or different neurons in the same layer or different layers of the neural network.

The crossbar array 720 of resistive elements has a plurality of word lines 702, a plurality of bit lines 704, and a plurality of resistive elements 706. Each resistive element 706 is located at a cross point of, and electrically coupled between, a respective word line 702 and a respective bit line 704. In some embodiments, a controller 450 is coupled to the crossbar array 720 and configured to select a subset of the plurality of resistive elements 706 to form the first resistor 440A. As the controller selects different subsets of the plurality of resistive elements 706, the first resistor 440A has variable resistance and is coupled between a first resistive terminal 720A and a second resistive terminal. In some embodiments, the first resistor 440A having variable resistance corresponds to a first weight of a neuron in a first layer of a corresponding neural network. In some embodiments, the neuron corresponds to a second weight in addition to the first weight, and the second weight is fixed and corresponds to one or more fixed weight resistors 440. In some embodiments, the first layer corresponds to a second weight in addition to the first weight, and the second weight is fixed and corresponds to one or more fixed weight resistors 440.

In some embodiments, each of the subset of selected resistive elements is coupled to one of a first subset of word lines 702 and one of a first subset of bit lines 704. A first selection circuit 708 is configured to select the first subset of word lines to be coupled to the first resistive terminal 720A, and a second selection circuit 710 is configured to select the first subset of bit lines to be coupled to the second resistive terminal 720B. Specifically, the first subset of word lines is shorted to the first resistive terminal 720A, and the first subset of line lines is shorted to the second resistive terminal 720B. In an example, the first subset of word lines 702 includes the top two word lines 702, and the first subset of bit lines includes the left two bit lines 704. The subset of selected resistive elements 706 forming the first resistor 440A1 includes a group 712 of four resistive elements 706, all of which are coupled in parallel between the resistive terminals 720A and 720B. The first resistor 440A includes the group 712 of four resistive elements 706 coupled in parallel. In some embodiments, resistance of the first resistor 440A1 varies by selecting different word lines 702 and bit lines 704. In some embodiments, resistance of the first resistor 440A1 varies by varying resistance of a subset or all of the selected resistive elements 706 (e.g., by exposure to illumination or changing their resistive states) while keeping word lines 702 and bit lines 704.

In another example, the first subset of word lines 702 includes the third top word line 702, and the first subset of bit lines includes at least three leftmost bit lines 704. The subset of selected resistive elements 706 forming the first resistor 440A2 includes a group 714 of resistive elements 706, all of which are coupled between the resistive terminals 720A and 720B. The first resistor 440A2 is applied as a resistor R1− 404 or R2− 406 coupled to a negative input 424N of the amplifier 424B. Stated another way, in some embodiments, the first resistor 440A2 is configured to convert any one of the positive weight resistors 440RP and the negative weight resistors 440RN in FIG. 4 to a variable resistor 600.

Further, in some embodiments, the plurality of weight resistors 440 includes a second resistor 440B1 that is also formed based on the crossbar array 720 of resistive elements. The first resistor 440A2 includes a first group 714 of resistive elements, and the second resistor 440B1 includes a second group 716 of selected resistive elements. Referring to FIG. 7, a second subset of word lines 702 is selected to define the second resistor 440B1 and includes the fourth top word line 702, and the first subset of bit lines includes at least three leftmost bit lines 704. A subset of selected resistive elements 706 forming the second resistor 440B1 includes the second group 716 of resistive elements 706, all of which are coupled between two resistive terminals of the second resistor 440B1. The second resistor 440B1 is applied as a resistor R1+ 408 or R2+ 410 (FIG. 4) coupled to a positive input 424P of the amplifier 424B. The first resistor 440A2 and the second resistors 440B1 have entirely different word lines 702, and share the same bit lines 704. Two different subsets of word lines 702 are coupled to two inputs of the amplifier 424B, and the subset of bit lines 704 selected by the second selection circuit 710 is configured to receive an input signal $U_1$ or $U_2$. In some embodiments, the first group 714 and the second group 716 are expanded to include all resistive elements in the corresponding row, and the subset of bit lines 704 includes all bit lines 704 of the crossbar array 720.

In some embodiments, the first resistor 440A2 is applied to implement the resistor R1− 404 of the amplifier 424B, and the second resistor 440B1 is applied to implement the resistor R1+ 408 of the amplifier 424B sharing a resistive terminal. The first resistor 440A2 and the second resistor 440B1 correspond to the first weight $w_1$ of the neural network corresponding to the neural network circuit 700. Conversely, in some embodiments not shown, the first resistor 440A and the second resistor 440B are coupled to the same amplifier (e.g., 424B), and do not share any common resistive terminal. In some embodiments, the first resistor 440A (e.g., R− 412) and the second resistor 440B (e.g., R+ 414) correspond to the same weight of the neural network. Alternatively, in some embodiments, the first resistor 440A (e.g., R1+) corresponds to a first weight $w_1$ of a neuron of the neural network, e.g., in equation (4), and the second resistor 440B (e.g., R2+) corresponds to a second weight $w_2$ of the same neuron of the neural network. The first weight $w_1$ and the second weight $w_2$ correspond to the same neuron or two distinct neurons in the same layer or different layers of the neural network.

Alternatively, in some embodiments, the controller 450 is configured to select a second subset 718 of resistive elements to form a second resistor 440B2 distinct from the first resistor 440A. Each of the second subset 718 of selected resistive elements is coupled to one of a second subset of word lines 702 and one of a second subset of bit lines 704. A third selection circuit is configured to select the second subset of word lines to be coupled to a first resistive terminal of the second resistor 440B2. A fourth selection circuit is configured to select the second subset of bit lines to be coupled to a second resistive terminal of the second resistor 440B2. In some embodiments, the third selection circuit is the first selection circuit 708, which is thereby configured to select two subsets of word lines concurrently. Alternatively, in some embodiments, the third selection circuit is distinct from the first selection circuit 708 and is configured to select the third subset of word lines independently from the first selection circuit 708. In some embodiments, the fourth selection circuit is the second selection circuit 710, which is thereby configured to select two subsets of bit lines concurrently. Alternatively, in some embodiments, the fourth selection circuit is distinct from the second selection circuit 710 and is configured to select the fourth subset of bit lines independently from the second selection circuit 710.

In some embodiments, the second resistor 440B2 is coupled to an amplifier 424N that is distinct from the amplifier 424A coupled to the first resistor 440A1. The first subset of bit lines of the first resistor 404A1 and the second subset of bit lines of the second resistor 440B2 do not have any common bit line 704. The first subset of word lines of the first resistor 404A1 and the second subset of word lines of the second resistor 440B2 do not have any common word line 702.

In some embodiments, the plurality of word lines 702 of the crossbar array 720 has a first number of word lines, and the plurality of resistive elements 706 includes at least a column of resistive elements coupled to a first bit line 704A and the plurality of word lines 702. Resistances of resistive elements 706 on the column of resistive elements coupled to the first bit line 704A are identical to one another. Stated another way, each bit line 704 is coupled to the first number of resistive elements having equal resistances.

In some embodiments, the plurality of bit lines 704 has a second number of bit lines, and a resistance of the first resistor 440A has a resolution corresponding to the second number of bit lines. The crossbar array 720 of resistive elements 706 includes at least a row of resistive elements coupled to a first word line 702A and the plurality of bit lines 704. The row of resistive elements has successively scaled resistances based on respective bit locations of the plurality of bit lines 704, enabling the resolution of the resistance of the first resistor 440A. For example, the crossbar array 720 has 6 bit lines 704. The resistive elements coupled to the first word line 702A has resistance of $R_0$, $2R_0$, $4R_0$, $8R_0$, $16R_0$, and $32R_0$. Based on the subset of bit lines 704 selected to form the first resistor 440A, resistance of the first resistor 440A coupled between the first word line 702 and the subset of bit lines has a 6-bit resolution. If two word lines are selected to form the first resistor 440, the resistance of the first resistor 440A is reduced by a half and continues to have a 6-bit resolution depending on the subset of bit lines 704.

One of ordinary skill in the art would recognize various ways to form a variable resistor 600 based on a crossbar array. It should be noted that details of devices and/or circuits described above with respect to FIG. 7 is also applicable in an analogous manner to the devices and/or circuits described below with respect to other figures (e.g., FIGS. 9 and 10). For brevity, these details are not repeated.

Figure 8A:
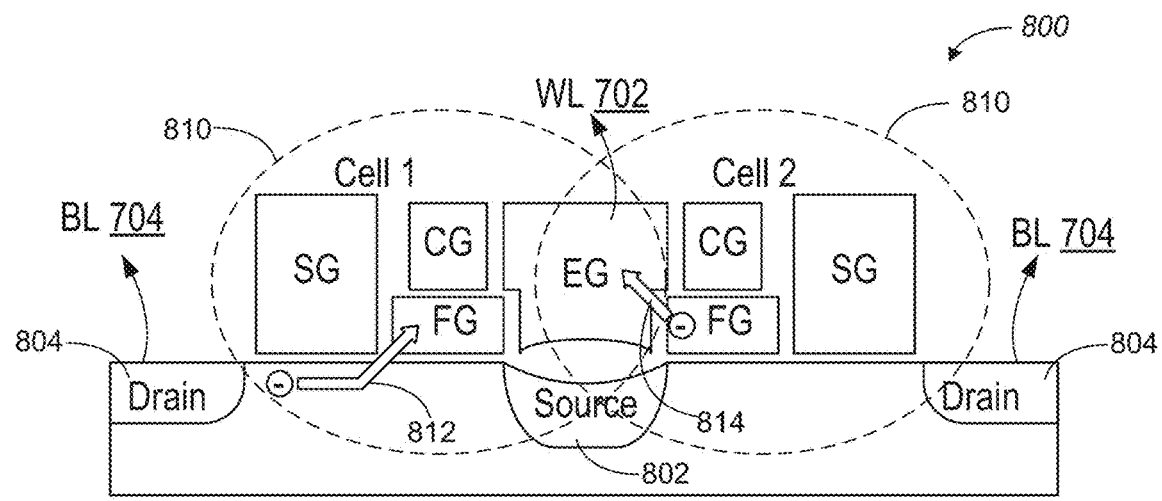
FIG. 8A is a cross sectional view of a superflash memory cell, in accordance with some embodiments.

FIG. 8A is a cross sectional view of a superflash memory cell 800, in accordance with some embodiments. The superflash memory cell 800 includes a NOR flash memory cell and has a split-gate cell structure. The superflash memory cell 800 includes two floating gate transistors 810 sharing a source 802 and having two distinct drains 804. The two distinct drains 804 are electrically coupled to two bit lines 704 of a crossbar array. Each floating gate transistor 810 of the superflash memory cell 800 includes a select gate SG, a coupling gate CG, a floating gate FG, and an erase gate EG. In some embodiments, each superflash memory cell 800 is coupled to six row lines, connecting transistor source 802, erase gates EGs, coupling gates CGs, and select gates SGs, while each column has only a bit line 704 connecting a drain 804 of a floating gate transistor 810 of the superflash memory cell 800. Electrons are transferred from a first channel to the floating gate FG within a first floating gate transistor during programming 812, and further from the floating gate FG of a second floating gate transistor to the erase gate EG during an erase operation 814.

In some embodiments, each superflash memory cell 800 is programmed individually by hot-electron injection into its floating gate FG. In some embodiments, a voltage is applied on the source line of the memory row is increased to 4.5 V, while those in other rows are kept at 0.5 V, with the proper column selected by lowering a voltage of the bit line (BL) voltage to 0.5 V (while keeping all other bit line voltages above 2.25 V). This process works well for providing proper digital state, with 1- or even 2-bit accuracy. It is insufficient for cell tuning with analog (say, 1%) precision. The reverse process ("erasure"), using the Fowler-Nordheim tunnelling of electron from the floating gates to the erase gates, may be performed, in the original arrays, only in the whole row, selected by applying a high voltage of ~11.5V to the corresponding erase gate line (with all other EG voltages kept at 0 V). These arrays do not allow for a precise analog cell tuning, which unavoidably requires an iterative, back-and-forth (program-read-erase-read-program . . . ) process, with the run-time result control.

In some embodiments, as the gates SG and CG are enabled, a current flows through the source 802 and the drain 804 of each of the two floating gate transistors 810 of each superflash memory cell 800, where the common source 802 is coupled to a word line 702 and the drains 804 are coupled to a bit line 704. Resistance is measured between the common source 802 and the drains 804 of the superflash memory cell 800, i.e., between the word line 702 and the bit line 704. Resistance of the superflash memory cell 800 varies based on a hot-electron injection level associated with a floating gate FG of its two floating gate transistors 810. In an example, a superflash memory cell 800 has a 4-bit precision and 16 stable analog levels corresponding to 16 distinct resistances. In another example, a superflash memory cell 800 has an 8 bit precision and 256 stable analog levels corresponding to 256 distinct resistances.

Figure 8B:
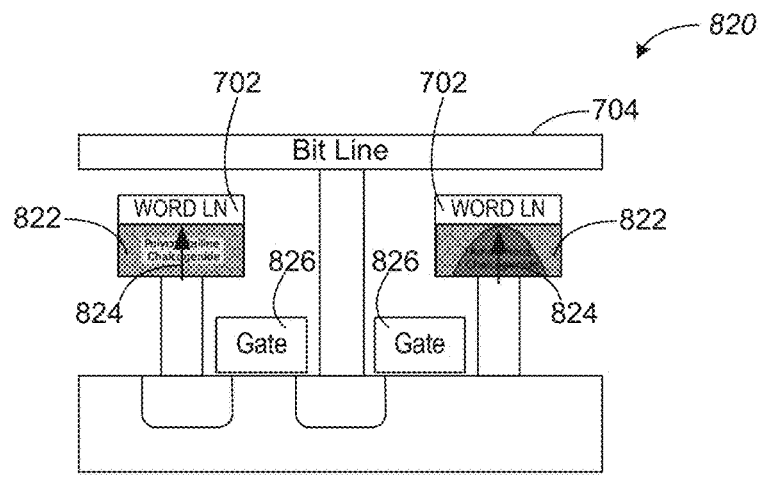
FIG. 8B is a cross sectional view of two PCM memory cells, in accordance with some embodiments.

FIG. 8B is a cross sectional view of two phase-change memory (PCM) memory cells 820, in accordance with some embodiments. Each PCM memory cell 820 includes a phase-change material 822 (e.g., chalcogenide glass) having a plurality of distinct conductive states (e.g., 64 states), and has distinct resistance associated with each of the plurality of distinct conductive states. The phase-change material 822 is configured to receive electrical current pulses 824, which generate heat when they travel through the phase-change material 822. The phase-change material 822 (e.g., chalcogenide glass) shifts into between basic states, polycrystalline and amorphous, through the passing of the electrical current pulses 824. As the phase-change material 822 transitions between the two basic states or stages, this gives rise to a term phase transition corresponding to the plurality of distinct conductive states of the phase-change material 822. In some embodiments, each PCM memory cell 820 has a low-resistance conductive state and a high-resistance crystalline state corresponding to the two basic states. In some embodiments, each PCM memory cell 820 has a low-resistance conductive state, a high-resistance crystalline state, and a set of intermediate states having different resistances. In other words, the electrical current pulses 824 set the phase-change material at one of the plurality of distinct conductive states, thereby writing data into the corresponding PCM memory cell 820 based on the plurality of distinct conductive states.

Each PCM memory cell 820 is coupled to a gate line 826, a word line 702, and a bit line 704. In some embodiments, a control signal is applied on the gate line 826 to enable data read and write operations into the respective PCM memory cell 820. As the control signal is enabled, the PCM memory cell 820 forms a resistive element between the word line 702 and the bit line 704, and has variable resistance corresponding to the one of the plurality of distinct conductive states to which the PCM memory cell 820 has been set.

In some embodiments, PCM is a type of non-volatile random-access memory (RAM), and is also called PCME, RAM of phase change (PRAM), ovonic unified memory (OUM), and chalcogenide RAM (C-RAM or CRAM). PCM exploits a unique behaviour of chalcogenide glass. In some embodiments, heat produced by passage of an electric current through a heating element (e.g., made of titanium nitride) of the PCM is used to either heat and quench the glass, making it amorphous, or to hold it in a crystallization temperature range for some time, thereby switching it to a crystalline state. PCM also has the ability to achieve a number of distinct intermediary states, thereby having the ability to hold multiple bits in a single cell, but the difficulties in programming cells in this way has prevented these capabilities from being implemented in other technologies (most notably flash memory) with the same capability.

Newer PCM technology has trended in two different directions. Research is being directed both towards attempting to find viable material alternatives to Ge2Sb2Te5 (GST), with mixed success. Other research has focused on the development of the use of a GeTe-Sb2Te3 superlattice to achieve non-thermal phase changes by simply changing the co-ordination state of the Germanium atoms with a laser pulse. This new Interfacial Phase-Change Memory (IPCM) has had many successes and continues to be the site of much active research. PCM has analog states, which are determined by phase state of a material applied by the PCM memory cells. In some embodiments, a PCM memory cell has 64 states.

Figure 8C:
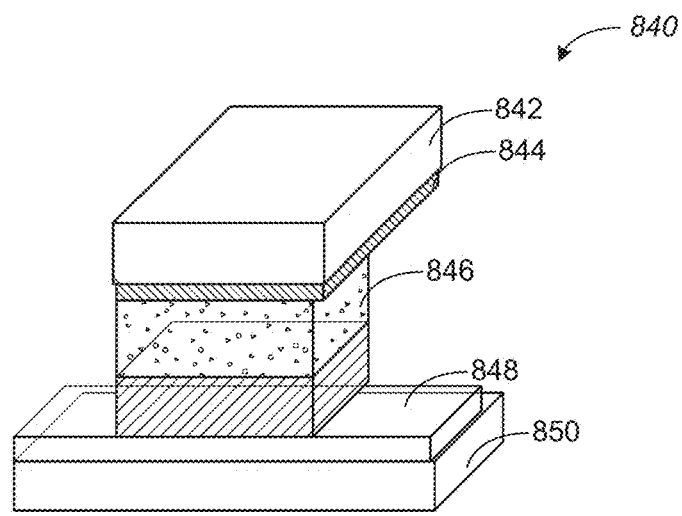
FIG. 8C is a perspective view of an example memristor, in accordance with some embodiments.
Figure 10:
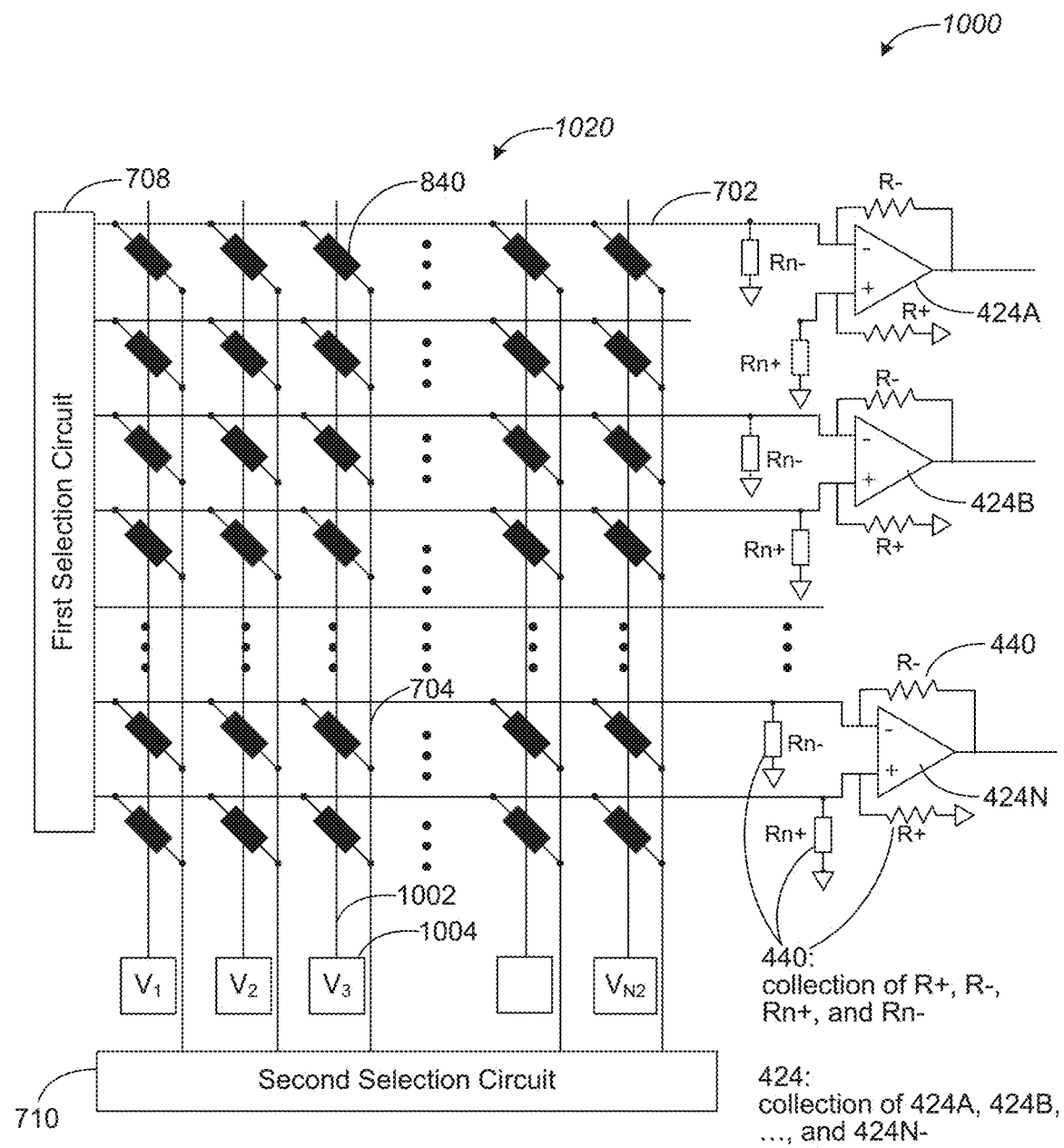
FIG. 10 is a schematic diagram of an example neural network circuit for implementing a neural network based on a crossbar array of memristors, in accordance with some embodiments.

FIG. 8C is a perspective view of an example memristor 840, in accordance with some embodiments. The example memristor 840 includes one or more of: a top electrode 842, an interfacial layer 844, a switching oxide 846, an interfacial layer 848, and a bottom electrode 850. In some embodiments, the top electrode 842 and the bottom electrode 850 are coupled to a word line 702 and a bit line 704 of a crossbar array 1020 of memory cells (FIG. 10). The memristor 840 (also called a portmanteau of memory resistor) includes a non-linear two-terminal electrical component relating electric charge and magnetic flux linkage, and has variable resistance measured between the two electrodes 842 and 850, depending on a history of electric charge previously flown through the memristor memory cell 840. Such a property is used to create a resistor with electrical resistance being reprogrammable by applying bursts of electric current to the memristor 840.

Figure 9:
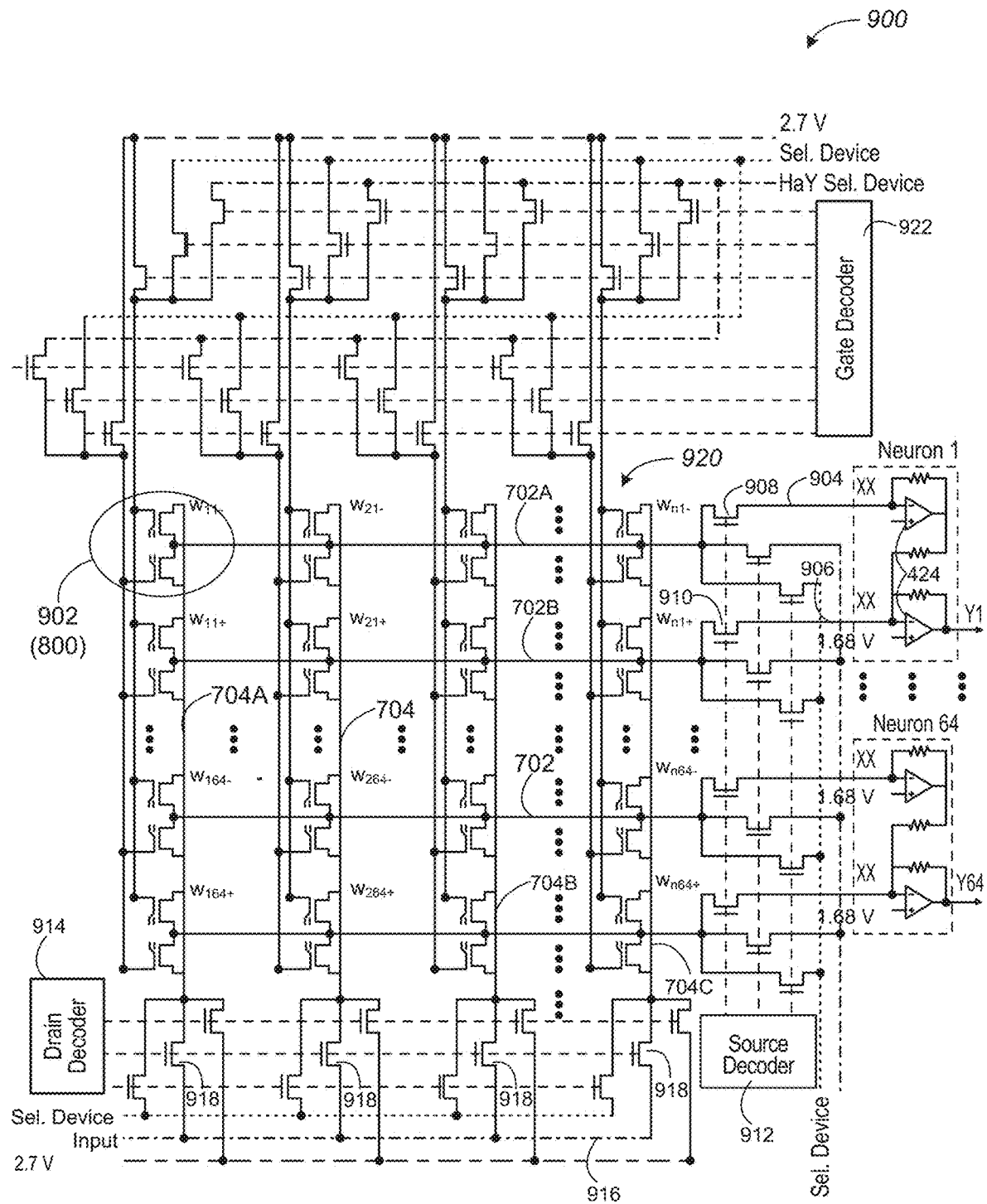
FIG. 9 is a schematic diagram of an example neural network circuit for implementing a neural network based on a crossbar array of superflash memory cells, in accordance with some embodiments.

FIG. 9 is a schematic diagram of an example neural network circuit 900 for implementing a neural network based on a crossbar array 920 of superflash memory cells 800, in accordance with some embodiments. A plurality of amplifiers 424 (e.g., 424A, 424B, . . . 424N) is coupled to a plurality of weight resistors 440 (e.g., resistors R+, R−, Rn+, and Rn-coupled to each amplifier 424) to form a neuron circuit 400 of a neural network circuit (FIG. 4). The plurality of weight resistors 440 corresponds to a plurality of weights of a neural network implemented by the neural network circuit. In some embodiments, the plurality of weight resistors 440 further includes a first resistor 440A formed based on a crossbar array 720 of resistive elements 706 (FIG. 7). In some embodiments, each resistive element 706 in the crossbar array 720 corresponds to a superflash memory cell 800, and the crossbar array 720 of resistive elements includes a crossbar array 920 of superflash memory cells 800. Each superflash memory cell 800 includes a NOR flash memory cell 902. The crossbar array 920 of superflash memory cells 800 is also called a crossbar array 920 of NOR flash memory cells 902. In some embodiments, the first resistor 440A includes the crossbar array 1020 of memristors 840. Alternatively, in some embodiments, the crossbar array 1020 of memristors 840 provides one or more additional weight resistors 440 in addition to the first resistor 440A. The one or more additional weight resistors 440 and the first resistor 440A optionally correspond to different weights of the same neuron or different neurons in the same layer or different layers of the neural network.

The crossbar array 920 of NOR flash memory cells 902 has a plurality of word lines 702, a plurality of bit lines 704, and a plurality of NOR flash memory cells 902. Each NOR flash memory cell 902 is located at a cross point of, and electrically coupled between, a respective word line 702 and a respective bit line 704 and configured to provide a respective NOR flash memory cell 902 as a respective resistive element 706. The crossbar array 920 of NOR flash memory cells 902 forms a non-volatile memory based on storage of electric charge on floating gates FGs of a floating gate transistors 810 (FIG. 8A). In some embodiments, the superflash memory cell 800 of each NOR flash memory cell 902 is configured to implement a multibit operation, and is reprogrammable through a writing interface.

In some embodiments, the crossbar array 920 of NOR flash memory cells 902 is coupled to a predefined number of operational amplifiers 424 to form a plurality of neuron circuits. In an example, each neuron circuit (e.g., Neuron 1 and Neuron 64) includes two operational amplifier 424 configured to receive a negative input 904 and a positive input 906. The predefined number is equal to a half of a first number ($N_1$) of rows in the crossbar array 920. The crossbar array 920 of NOR flash memory cells 902 has 128 rows of NOR flash memory cells 902, and every two rows of NOR flash memory cells 902 are coupled to the negative input 904 and the positive input 906 of a respective neuron circuit. More specifically, a first row of every two rows of NOR flash memory cells 902 is coupled to a negative word line 702A, which is coupled to the negative input 904 of the respective neuron circuit (e.g., Neuron 1) via a switch 908 (e.g., implemented by a transistor). A second row of every two rows of NOR flash memory cells 902 is coupled to a positive word line 702B, which is coupled to the positive input 906 of the respective neuron circuit (e.g., Neuron 1) via a switch 910 (e.g., implemented by a transistor). The switches 908 and 910 are controlled jointly via a source decoder 912.

In some embodiments, each flash memory cell 800 has a number (e.g., 256) of stable analog levels corresponding to the same number of distinct resistances. The crossbar array 920 has a second number ($N_2$) of bit lines or columns of superflash memory cells 800 coupled to a drain decoder 914, and the drain decoder 914 is configured to select a subset of bit lines 704 (e.g., a single bit line 704, multiple bit lines 704) as an input 916 to a respective neuron circuit via one or more switches 918 (e.g., implemented by transistors). The superflash memory cells 800 coupled to the same bit line is set to the same analog level selected from the number of stable analog levels of the flash memory cells 800, and have the same resistance. In some embodiments, superflash memory cells 800 coupled to different bit lines 704 in the crossbar array 920 has common resistance. A first resistor 440A coupled between the input 916 and the first row line 702A has variable conductance linearly increases with a number of bit lines that are selected by the drain decoder 914, so is a second resistor 440B coupled between the input 916 and the second row line 702B. Conversely, in some embodiments, superflash memory cells 800 coupled to different bit lines 704 in the crossbar array 920 has different resistances based on their bit positions in the crossbar array 920. For example, a leftmost column of flash memory cells 800 has resistance $R_0$, and an i-th column of flash memory cells 800 has resistance $2^{i-1}R_0$, where i=1, 2, 3, . . . , or $N_2$. Variable conductance of the first resistor 440A and the second resistor 440B are controlled with a precision of $N_2$ bits, so are variable resistance of the resistors 440A and 440B.

The crossbar array 920 of NOR flash memory cells 902 are further coupled to a gate decoder 922, switches, and different voltage levels. The gate decoder 922 and switches are configured to program and erase the analog levels set at each superflash memory cell 800, thereby creating different resistance or conductance for the superflash memory cell 800. For example, superflash memory cells 800 coupled to different bit lines 704 in the crossbar array 920 are programmed to have common resistance. In another example, while superflash memory cells 800 coupled to the same bit line 704 is set to the same resistance, superflash memory cells 800 coupled to different bit lines 704 in the crossbar array 920 has different resistances based on their bit positions in the crossbar array 920.

In some embodiments, each neuron circuit has a distinct input 916 that is coupled to a respective set of distinct bit lines 704. For example, an input 916 of a first neuron circuit (e.g., Neuron 1) is coupled to a bit line 704A. An input 916 of a second neuron circuit (e.g., Neuron 64) is coupled to two bit lines 704B and 704C. In some situations, the neural network corresponding to the neural network circuit 900 is retrained to result in updated weights. In some embodiments, the bit lines coupled to the input of each neuron circuit do not change, and the superflash memory cells 800 corresponding to the updated weights are reprogrammed with updated analog levels based on the updated weights. Alternatively, in some embodiments, bit lines coupled to the input 916 of one or more neuron circuits and/or word lines coupled to the input 904 or 906 of the amplifier 424 are recoupled to provide the updated weights, while none of the superflash memory cells 800 is programmed based on the updated weights. Alternatively, in some embodiments, lines coupled to the input 904, 906, or 916 are recoupled to provide the updated weights, while a subset of superflash memory cells 800 is also programmed based on the updated weights.

In some embodiments, compared with the crossbar array 920 of NOR flash memory cells 902, the crossbar array 720 of resistors is more robust, has smaller footprint, is compatible with BEOL layers, and does not need read and write circuitry. In some embodiments, a neural network has both fixed weights corresponding to fixed weight resistors and flexible weights corresponding to variable weight resistors. A number of fixed weight resistors is greater than a number of variable weight resistors. Further, in some situations, 90% of weight resistors of a neural network circuit are fixed resistors, while 10% or less of the weight resistors are made using flexible resistors (e.g., crossbar arrays 720 of resistors). In some situations, only 5% or less of the weight resistors are made using flexible resistors based on the crossbar array 920 of NOR flash memory cells 902.

FIG. 10 is a schematic diagram of an example neural network circuit 1000 for implementing a neural network based on a crossbar array 1020 of memristors 840, in accordance with some embodiments. A plurality of amplifiers 424 (e.g., 424A, 424B, . . . 424N) is coupled to a plurality of weight resistors 440 (e.g., resistors R+, R−, Rn+, and Rn− coupled to each amplifier 424) to form a neuron circuit 400 of a neural network circuit (FIG. 4). The plurality of weight resistors 440 corresponding to a plurality of weights of a neural network implemented by the neural network circuit. In some embodiments, the plurality of weight resistors 440 further includes a first resistor 440A formed based on a crossbar array 720 of resistive elements 706 (FIG. 7). In some embodiments, each resistive element 706 in the crossbar array 720 corresponds to a memristor 840, and the crossbar array 720 of resistive elements includes a crossbar array 1020 of memristors 840. Alternatively, in some embodiments, the crossbar array 1020 of memristors 840 provides one or more additional weight resistors 440 in addition to the first resistor 440A. The one or more additional weight resistors 440 and the first resistor 440A optionally correspond to different weights of the same neuron or different neurons in the same layer or different layers of the neural network.

The crossbar array 1020 of memristors 840 has a plurality of word lines 702, a plurality of bit lines 704, and a plurality of memristors 840. Each memristor 840 is located at a cross point of, and electrically coupled between, a respective word line 702 and a respective bit line 704 and configured to provide a respective resistive element. In some embodiments, the plurality of memristors 840 includes at least a row of memristors coupled to a first word line 702A and the plurality of bit lines 704. The row of memristors 840 has successively scaled resistances based on respective bit locations of the plurality of bit lines 704, enabling a resolution of a resistance of the first resistor 440A having variable resistance. In some embodiments, each memristor 840 is configured to provide a plurality of resistance states and pre-programmed to a respective one of the plurality of resistance states based on a bit location of the respective bit line 704 to which the respective memristor is coupled.

In some embodiments, each resistive element 706 of a crossbar array 720 includes a respective memristor 840 to form the crossbar array 1020. The crossbar array 1020 is further coupled to a plurality of voltage lines 1002 coupled to a plurality of columns of memristors 840. Each voltage line 1002 is coupled to a respective column of memristor 840, and driven by a voltage generator 1004. Each voltage line 1002 is configured to program the column of memristors 840 to a resistance state based on a bit location of the respective bit line 704. For example, memristors of the same row are set to successively scaled resistances $R_0$, $2R_0$, $4R_0$, and $8R_0$.

In some embodiments not shown, the crossbar array 1020 is based on PCM memory cells 820. Each memristor 840 is replaced with a PCM memory cell 820. The crossbar array 1020 of PCM memory cell 820 has a plurality of word lines 702, a plurality of bit lines 704, and a plurality of PCM memory cells 820. Each PCM memory cell 820 is located at a cross point of, and electrically coupled between, a respective word line 702 and a respective bit line 704 and configured to provide a respective resistive element. Also, in some embodiments not shown, a variable resistor of a neural network circuit includes at least a portion of a crossbar array of magnetoresistive memory cells having a plurality of word lines, a plurality of bit lines, and a plurality of magnetoresistive memory cells. Each magnetoresistive memory cell is located at a cross point of, and electrically coupled between, a respective word line and a respective bit line and configured to provide a respective resistive element.

In some situations, the neural network corresponding to the neural network circuit 1000 is retrained to result in updated weights. In some embodiments, the memristors 840 or PCM memory cells 800 selected by the word and bit lines do not change, and the memristors 840 or PCM memory cells 800 corresponding to the updated weights are reprogrammed based on the updated weights. Alternatively, in some embodiments, the memristors 840 or PCM memory cells 800 are reselected by different word and bit lines to provide the updated weights, and none of the memristors 840 or PCM memory cells 800 in the crossbar array 1020 is programmed based on the updated weights. Alternatively, in some embodiments, the memristors 840 or PCM memory cells 800 are reselected by different word and bit lines to provide the updated weights, and a subset of the memristors 840 or PCM memory cells 800 is programmed based on the updated weights.

In some embodiments, each of the neural network circuits 700, 900, and 1000 is also called a neuromorphic analog signal processor (NASP). The NASP includes a plurality of weight resistors 440 and a plurality of operational amplifier 424 (FIG. 4). A subset of amplifiers is used to combine a plurality of input signals of each neuron in a substantially linear manner, and a subset of amplifiers is used to realize an activation function for the neuron. The resistors 440 realize weights of a corresponding neural network, thereby acting like analog memory cells. In some embodiments, a resistor includes a crossbar array of memory cells having an 8-bit precision, and the resistor therefore has an 8-bit resolution. In some embodiments, a weight resistor 440 has resistance in a range of 100 kiloohm to 10 megaohm. Further, in some embodiments, the weight resistor 440 has variable resistance corresponding to a plurality of stable and clearly distinguishable analog values (e.g., 64 resistance values). In some embodiments, the weight resistor 440 includes a crossbar array of superflash memory cells 800, PCM memory cells 820, or memristors 840. Each of these memory cells provides a reconfigurable analog weight for the NASP multiple times during a chip lifetime. Stated another way, a memory cell 800, 820, or 840 acts as an analog memory element with a 6-bit or higher precision, has a capability to be reprogrammed after the NASP has been manufactured, and is configured to adjust a weight of the neural network embedded into the NASP.

Conversely, in some embodiments, a fixed resistor is used to enable a non-reconfigurable analog weight for NASP. In some embodiments, a crossbar array of memory cells is used to provide the fixed resistor without recoupling the bit lines 704 or reprogramming each memory cell. Such a fixed resistor allows the required precision to be achieved and therefore act as non-reconfigurable analog memory to store the non-reconfigurable analog weight for NASP. In some embodiments, these fixed resistors are used as fixed-value analog memory elements with 6-bit or better precision. These resistors are programmed during chip manufacturing and not changeable afterwards.

One of ordinary skill in the art would recognize various ways to form a variable resistor. It should be noted that details of devices and/or circuits described above with respect to any of FIGS. 6A-10 are also applicable in an analogous manner to the devices and/or circuits described above with respect to other figure in FIGS. 6A-10. For brevity, these details are not repeated here.

A fixed-resistors part of the neural network and a reprogrammable part of the neural network are combined via the NASP (e.g., neural network circuits 700, 900, and 1000). The fixed-resistors part of the neural network represents descriptor (embedding) computation. In some embodiments, the reprogrammable part of the neural network uses multi-level flash memory cells 800, phase-change memory cells 820, or memristors 840, which represent a classifier part of the neural network and can be programmed accordingly to a specific task and updated during a lifetime of the NASP. Programming of the crossbar arrays of corresponding memory cells is done through respective writing circuits.

In some embodiments, a neural network includes a large number of layers, i.e., a number of layers of the neural network exceeds a predefined threshold layer number NTH. The neural network is fragmented into a plurality of neural network fragments, which are implemented in a plurality of chip areas. In some embodiments, the neural network includes a convolutional neural network having an autoencoder architecture with classifier part. The classifier part is implemented and programmable based on a crossbar array of resistive elements 706 or memory cells. Particularly, the corresponding NASP is programmable during or after chip manufacturing.

In some embodiments, a neural network has a plurality of weights including a first portion of fixed weights and a second portion of adjustable weights. The first portion of fixed weights are implemented based on fixed resistors, and the second portion of adjustable weights are implemented based on crossbar arrays of memory cells (e.g., superflash memory cells 800, PCM memory cells 820, or memristors 840). The neural network circuit (i.e., NASP) includes both programmable elements and resistors in the same neural network hardware realization. Such combination allows to make compact resistor-based fixed weights circuit (which delivers at output the descriptor) and changing part (which represent classifier part of the Neural Network). By these means, reprogrammable realization of the neural networks is accomplished.

In some embodiments, the crossbar array 920 of superflash memory cells 800 has a 6-bit precision. In some embodiments, the crossbar array 1020 of memristors 840 has an 8-bit precision. In some embodiments, the crossbar array 1020 of PCM memory cells 820 has a 4-bit precision.

In some embodiments, a neural network is configured to detect keywords. The neural network has a first set of feature extraction layers implemented with fixed resistors and a second set of reprogrammable layers implemented with a crossbar array of memory cells. In an example, the first set of layers includes 10 layers, and the second set of layers includes 4 layers. In some embodiments, the neural network is retrained to detect different sets of keywords, and the corresponding neural network circuit is reprogrammed after chip manufacturing or on the fly. In some situations, such hardware realization allows the same neural network circuit to be reprogrammed to recognize different sets of 10 keywords in different languages and different voices.

In some embodiments, a neural network is configured for human activity recognition. The neural network has twelve layers, nine of which are realized using fixed resistors. Three last layers coupled to an output of the neural network are realized using a crossbar array 1020 of memristors 840. This neural network is trained to distinguish several signature human activities, which are then recognized by the last three layers of the neural network. The use of the crossbar array 1020 of memristors 840 allows programming and introduction of signature human activities after chip manufacturing.

In some embodiments, a NASP is applied to implement the Mobile Net v.2, which consists of 110000 neurons and used for different classification tasks on edge devices. The Mobile Net is split into 29 segments that are loaded consecutively and fragment by fragment into the NASP having 36000×3600 neurons and fully flexible 12 000000 connections. The change of weights is realized on the fly, as each fragment requires its own weights to be fixed during its operation.

Some example embodiments of this application are described as follows:

Clause 1. An electronic device, comprising: a plurality of resistors corresponding to a plurality of weights of a neural network, wherein the plurality of resistors includes a first resistor corresponding to a first weight of the neural network; and one or more amplifiers coupled to the plurality of resistors, wherein the one or more amplifiers and the plurality of resistors are configured to form a neural network circuit associated with the neural network.

Clause 2. The electronic device of clause 1, wherein the first resistor has a variable resistance.

Clause 3. The electronic device of clause 2, wherein the first resistor includes at least one photo resistor, which is configured to be exposed to a controllable source of light, whereas the variable resistance of the first resistor depends on a brightness level of the controllable source of light.

Clause 4. The electronic device of clause 2 or 3, wherein the photo resistor includes one or more of: cadmium sulfide (CdS), cadmium selenide (CdSe), lead sulfide (PbS) and indium antimonide (InSb), and titanium oxide (TiO2).

Clause 5. The electronic device of clause 2, 3, or 4, wherein the first resistor is configured to have a first resistance and a second resistance, and the electronic device further comprises a controller configured to: in accordance with a determination that the first weight of the neural network has a first value, control the first resistor to provide the first resistance; and in accordance with a determination that the first weight of the neural network has a second value, control the first resistor to provide the second resistance.

Clause 6. The electronic device of any of clauses 1-5, wherein the first resistor is formed based on a crossbar array of resistive elements having a plurality of word lines, a plurality of bit lines, and a plurality of resistive elements, wherein each resistive element is located at a cross point of, and electrically coupled between, a respective word line and a respective bit line.

Clause 7. The electronic device of clause 6, further comprising a controller configured to select a subset of the plurality of resistive elements to form the first resistor.

Clause 8. The electronic device of clause 7, wherein each of the subset of selected resistive elements is coupled to one of a first subset of word lines and one of a first subset of bit lines, the electronic device further comprising: a first selection circuit configured to select the first subset of word lines to be coupled to a first resistive terminal of the first resistor; and a second selection circuit configured to select the first subset of bit lines to be coupled to a second resistive terminal of the first resistor.

Clause 9. The electronic device of clause 8, wherein: the crossbar of resistive elements further includes a subset of second resistive elements selected to form a second resistor; each of the subset of second resistive elements is coupled to one of a second subset of word lines and one of the first subset of bit lines; the second subset of word lines is selected to be coupled to a first resistive terminal of the second resistor; the subset of bit lines is coupled to a second resistive terminal of the second resistor; and the first resistor and the second resistor is coupled to a first amplifier.

Clause 10. The electronic device of clause 7, wherein the controller is configured to select a second subset of resistive elements to form a second resistor distinct from the first resistor, and each of the second subset of selected resistive elements is coupled to one of a second subset of word lines and one of a second subset of bit lines, the electronic device further comprising: a third selection circuit configured to select the second subset of word lines to be coupled to a first resistive terminal of the second resistor; and a fourth selection circuit configured to select the second subset of bit lines to be coupled to a second resistive terminal of the second resistor.

Clause 11. The electronic device of clause 10, wherein the first resistor and the second resistor correspond to the first weight of the neural network.

Clause 12. The electronic device of clause 10, wherein the first resistor corresponds to a first weight of the neural network, and the second resistor corresponds to a second weight of the neural network, and wherein the first weight and the second weight correspond to the same neuron or two distinct neurons in the same layer or different layers of the neural network.

Clause 13. The electronic device of any of clauses 6-12, wherein: the plurality of word lines consists of a predefined number of word lines; the plurality of resistive elements includes at least a column of resistive elements coupled to a first bit line and the plurality of word lines; and resistances of resistive elements on the column of resistive elements coupled to the first bit line are identical to one another.

Clause 14. The electronic device of any of clauses 6-13, wherein: the plurality of bit lines consists of a predefined number of bit lines, and a resistance of the first resistor has a resolution corresponding to the predefined number of bit lines; and the plurality of resistive elements includes at least a row of resistive elements coupled to a first word line and the plurality of bit lines; and the row of resistive elements has successively scaled resistances based on respective bit locations of the plurality of bit lines, enabling the resolution of the resistance of the first resistor.

Clause 15. The electronic device of any of clauses 6-14, wherein the first resistor includes a base resistor and a variable resistor, and the variable resistor is coupled in parallel with the base resistor and further includes the crossbar array of resistive elements.

Clause 16. The electronic device of any of clauses 6-15, wherein the first resistor includes a base resistor and a variable resistor, and the variable resistor is coupled in series with the base resistor and further includes the crossbar array of resistive elements.

Clause 17. The electronic device of any of clauses 1-16, wherein the first resistor further includes at least a portion of: a crossbar array of NOR flash memory cells having a plurality of word lines, a plurality of bit lines, and a plurality of NOR flash memory cells, wherein each NOR flash memory cell is located at a cross point of, and electrically coupled between, a respective word line and a respective bit line and configured to provide a respective NOR flash memory cell as a respective resistive element.

Clause 18. The electronic device of any of clauses 1-16, wherein the first resistor further includes at least a portion of: a crossbar array of memristors having a plurality of word lines, a plurality of bit lines, and a plurality of memristors, wherein each memristor is located at a cross point of, and electrically coupled between, a respective word line and a respective bit line and configured to provide a respective resistive element.

Clause 19. The electronic device of clause 18, wherein: the plurality of memristors includes at least a row of memristors coupled to a first word line and the plurality of bit lines; and the row of memristors has successively scaled resistances based on respective bit locations of the plurality of bit lines, enabling a resolution of a resistance of the first resistor.

Clause 20. The electronic device of clause 18, wherein each memristor is configured to provide a plurality of resistance states and pre-programmed to a respective one of the plurality of resistance states based on a bit location of the respective bit line to which the respective memristor is coupled.

Clause 21. The electronic device of any of clauses 1-16, wherein the first resistor further includes at least a portion of: a crossbar array of phase-change memory (PCM) memory cells having a plurality of word lines, a plurality of bit lines, and a plurality of PCM memory cells, wherein each PCM memory cell is located at a cross point of, and electrically coupled between, a respective word line and a respective bit line and configured to provide a respective resistive element.

Clause 22. The electronic device of any of clauses 1-16, wherein the first resistor further includes includes at least a portion of: a crossbar array of magnetoresistive memory cells having a plurality of word lines, a plurality of bit lines, and a plurality of magnetoresistive memory cells, wherein each magnetoresistive memory cell is located at a cross point of, and electrically coupled between, a respective word line and a respective bit line and configured to provide a respective resistive element.

Clause 23. The electronic device of any of clauses 1-22, wherein the neural network includes a first number of layers, and the first number is greater than a predefined threshold layer number NTH.

Clause 24. The electronic device of clause any of clauses 1-23, wherein the neural network includes a plurality of neural layers further including a subset of neural layers that is coupled to an output of the neural network, and the subset of neural layers includes the first weight.

Clause 25. The electronic device of any of clauses 1-24, further comprising: a combination circuit including an operational amplifier, a subset of resistors, two or more input interfaces, and an output interface, the combination circuit corresponding to a neuron of the neural network and configured to obtain two or more input signals at the two or more input interfaces, combine the two or more input signals, and generate an output, the subset of resistors including the first resistor.

Clause 26. An integrated circuit, comprising: a plurality of resistors corresponding to a plurality of weights of a neural network, wherein the one or more amplifiers and the plurality of resistors are characterized in any method of clauses 1-25.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An electronic device, comprising:
   a plurality of resistors corresponding to a plurality of weights of a neural network, wherein the plurality of resistors includes a first resistor corresponding to a first weight of the neural network; and
   one or more amplifiers coupled to the plurality of resistors, wherein the one or more amplifiers and the plurality of resistors are configured to form a neural network circuit associated with the neural network, wherein:
      the first resistor has a variable resistance;
      the first resistor includes at least one photo resistor, which is configured to be exposed to a controllable source of light; and
      the variable resistance of the first resistor depends on a brightness level of the controllable source of light.

2. An integrated circuit, comprising:
   a plurality of resistors corresponding to a plurality of weights of a neural network, wherein the plurality of resistors includes a first resistor corresponding to a first weight of the neural network; and
   one or more amplifiers coupled to the plurality of resistors, wherein the one or more amplifiers and the plurality of resistors are configured to form a neural network circuit associated with the neural network, wherein:
      the first resistor has a variable resistance;
      the first resistor includes at least one photo resistor, which is configured to be exposed to a controllable source of light; and
      the variable resistance of the first resistor depends on a brightness level of the controllable source of light.

3. The integrated circuit of claim 2, wherein the first resistor is configured to have a first resistance and a second resistance, and the electronic device further comprises a controller configured to:
   in accordance with a determination that the first weight of the neural network has a first value, control the first resistor to provide the first resistance; and
   in accordance with a determination that the first weight of the neural network has a second value, control the first resistor to provide the second resistance.

4. An integrated circuit, comprising:
   a plurality of resistors corresponding to a plurality of weights of a neural network, wherein the plurality of resistors includes a first resistor corresponding to a first weight of the neural network; and
   one or more amplifiers coupled to the plurality of resistors, wherein the one or more amplifiers and the plurality of resistors are configured to form a neural network circuit associated with the neural network, wherein;
      the first resistor is formed based on a crossbar array of resistive elements having a plurality of word lines, a plurality of bit lines, and a plurality of resistive elements, and
      each resistive element is located at a cross point of, and electrically coupled between, a respective word line and a respective bit line.

5. The integrated circuit of claim 4, further comprising a controller configured to select a subset of the plurality of resistive elements to form the first resistor.

6. The integrated circuit of claim 5, wherein each of the subset of selected resistive elements is coupled to one of a first subset of word lines and one of a first subset of bit lines, the electronic device further comprising:
   a first selection circuit configured to select the first subset of word lines to be coupled to a first resistive terminal of the first resistor; and
   a second selection circuit configured to select the first subset of bit lines to be coupled to a second resistive terminal of the first resistor.

7. The integrated circuit of claim 6, wherein:
   the crossbar of resistive elements further includes a subset of second resistive elements selected to form a second resistor;
   each of the subset of second resistive elements is coupled to one of a second subset of word lines and one of the first subset of bit lines;
   the second subset of word lines is selected to be coupled to a first resistive terminal of the second resistor;
   the subset of bit lines is coupled to a second resistive terminal of the second resistor; and
   the first resistor and the second resistor is coupled to a first amplifier.

8. The integrated circuit of claim 5, wherein the controller is configured to select a second subset of resistive elements to form a second resistor distinct from the first resistor, and each of the second subset of selected resistive elements is coupled to one of a second subset of word lines and one of a second subset of bit lines, the electronic device further comprising:
- a third selection circuit configured to select the second subset of word lines to be coupled to a first resistive terminal of the second resistor; and
- a fourth selection circuit configured to select the second subset of bit lines to be coupled to a second resistive terminal of the second resistor.

9. The integrated circuit of claim 8, wherein the first resistor and the second resistor correspond to the first weight of the neural network.

10. The integrated circuit of claim 8, wherein the first resistor corresponds to a first weight of the neural network, and the second resistor corresponds to a second weight of the neural network, and wherein the first weight and the second weight correspond to the same neuron or two distinct neurons in a same layer or different layers of the neural network.

11. The integrated circuit of claim 4, wherein:
the plurality of word lines consists of a predefined number of word lines;
the plurality of resistive elements includes at least a column of resistive elements coupled to a first bit line and the plurality of word lines; and
resistances of resistive elements on the column of resistive elements coupled to the first bit line are identical to one another.

12. The integrated circuit of claim 4, wherein:
the plurality of bit lines consists of a predefined number of bit lines, and a resistance of the first resistor has a resolution corresponding to the predefined number of bit lines; and
the plurality of resistive elements includes at least a row of resistive elements coupled to a first word line and the plurality of bit lines; and
the row of resistive elements has successively scaled resistances based on respective bit locations of the plurality of bit lines, enabling the resolution of the resistance of the first resistor.

13. The integrated circuit of claim 4, wherein the first resistor includes a base resistor and a variable resistor, the variable resistor is coupled in parallel with the base resistor, and the variable resistor further includes the crossbar array of resistive elements.

14. The integrated circuit of claim 4, wherein the first resistor includes a base resistor and a variable resistor, the variable resistor is coupled in series with the base resistor, and the variable resistor further includes the crossbar array of resistive elements.

15. The integrated circuit of claim 4, wherein:
the crossbar array is a crossbar array of NOR flash memory cells having a plurality of NOR flash memory cells; and
each NOR flash memory cell is located at a cross point of, and electrically coupled between, a respective word line and a respective bit line and configured to provide a respective NOR flash memory cell as a respective resistive element.

16. The integrated circuit of claim 4, wherein:
the crossbar array is a crossbar array of memristors.

17. The integrated circuit of claim 16, wherein:
the plurality of memristors includes at least a row of memristors coupled to a first word line and the plurality of bit lines; and
the row of memristors has successively scaled resistances based on respective bit locations of the plurality of bit lines, enabling a resolution of a resistance of the first resistor.

18. The integrated circuit of claim 16, wherein each memristor is configured to provide a plurality of resistance states and pre-programmed to a respective one of the plurality of resistance states based on a bit location of the respective bit line to which the respective memristor is coupled.

19. The integrated circuit of claim 4, wherein:
the crossbar array is a crossbar array of phase-change memory (PCM) memory cells having a plurality of PCM memory cells; and,
each PCM memory cell is located at a cross point of, and electrically coupled between, a respective word line and a respective bit line and configured to provide a respective resistive element.

20. The integrated circuit of claim 4, wherein:
the crossbar array is a crossbar array of magnetoresistive memory cells having a plurality of magnetoresistive memory cells; and
each magnetoresistive memory cell is located at a cross point of, and electrically coupled between, a respective word line and a respective bit line and configured to provide a respective resistive element.

21. The integrated circuit of claim 2, wherein the neural network includes a first number of layers, and the first number is greater than a predefined threshold layer number NTH.

22. The integrated circuit of claim 2, wherein the neural network includes a plurality of neural layers further including a subset of neural layers that is coupled to an output of the neural network, and the subset of neural layers includes the first weight.

23. The integrated circuit of claim 2, further comprising:
a combination circuit including an operational amplifier, a subset of resistors, two or more input interfaces, and an output interface, the combination circuit corresponding to a neuron of the neural network and configured to obtain two or more input signals at the two or more input interfaces, combine the two or more input signals, and generate an output, the subset of resistors including the first resistor.

24. The integrated circuit of claim 2, wherein the photo resistor includes one or more of: cadmium sulfide (CdS), cadmium selenide (CdSe), lead sulfide (PbS) and indium antimonide (InSb), and titanium oxide (TiO2).

25. The integrated circuit of claim 4, wherein the neural network includes a first number of layers, and the first number is greater than a predefined threshold layer number NTH.

26. The integrated circuit of claim 4, wherein the neural network includes a plurality of neural layers further including a subset of neural layers that is coupled to an output of the neural network, and the subset of neural layers includes the first weight.

27. The integrated circuit of claim 4, further comprising:
a combination circuit including an operational amplifier, a subset of resistors, two or more input interfaces, and an output interface, the combination circuit corresponding to a neuron of the neural network and configured to obtain two or more input signals at the two or more input interfaces, combine the two or more input signals, and generate an output, the subset of resistors including the first resistor.

28. An electronic device, comprising:
a plurality of resistors corresponding to a plurality of weights of a neural network, wherein the plurality of resistors includes a first resistor corresponding to a first weight of the neural network; and
one or more amplifiers coupled to the plurality of resistors, wherein the one or more amplifiers and the plurality of resistors are configured to form a neural network circuit associated with the neural network, wherein:
   the first resistor is formed based on a crossbar array of resistive elements having a plurality of word lines, a plurality of bit lines, and a plurality of resistive elements; and
   each resistive element is located at a cross point of, and electrically coupled between, a respective word line and a respective bit line.

* * * * *